United States Patent [19]

Andoh et al.

[11] Patent Number: 5,539,461
[45] Date of Patent: Jul. 23, 1996

[54] SOLID STATE IMAGE SENSOR AND A DRIVING METHOD THEREOF

[75] Inventors: Fumihiko Andoh, Tokyo; Kazuhisa Taketoshi, Kanagawa; Katsu Tanaka, Tokyo; Masao Yamawaki, Hyogo; Hidekazu Yamamoto, Hyogo; Hiroshi Kawashima, Hyogo; Naofumi Murata, Hyogo, all of Japan

[73] Assignees: Nippon Hoso Kyokai; Mitsubishi Denki Kabushiki Kaisha, both of Tokyo, Japan

[21] Appl. No.: 216,535

[22] Filed: Mar. 23, 1994

[30] Foreign Application Priority Data

Mar. 23, 1993 [JP] Japan .................................. 5-062333
Nov. 29, 1993 [JP] Japan .................................. 5-297676

[51] Int. Cl.$^6$ ............................ H04N 3/12; H04N 3/14; H04N 9/07
[52] U.S. Cl. .......................... 348/308; 348/301; 348/320; 250/208.1
[58] Field of Search ...................... 348/308, 300, 348/910, 277, 302, 305, 317, 320; 250/208.1; H04N 5/335, 9/07, 3/12, 3/14

[56] References Cited

U.S. PATENT DOCUMENTS

| | | | |
|---|---|---|---|
| 4,032,903 | 6/1977 | Weimer | 340/173 R |
| 4,445,117 | 4/1984 | Gaalema et al. | 340/825.91 |
| 4,516,017 | 5/1985 | Hara et al. | 235/472 |
| 4,745,480 | 5/1988 | Kinugasa et al. | 358/213.15 |
| 4,768,084 | 8/1988 | Noda et al. | 348/277 |
| 4,791,308 | 12/1988 | Nagashima | 250/578 |
| 5,296,696 | 3/1994 | Uno | 250/208.1 |

FOREIGN PATENT DOCUMENTS

| | | | |
|---|---|---|---|
| 481373 | 4/1992 | European Pat. Off. | H04N 3/15 |
| 3345239 | 6/1984 | Germany | H01L 27/14 |
| 3345175 | 6/1984 | Germany | H01L 27/14 |
| 3345147 | 6/1984 | Germany | H04N 3/15 |
| 3345176 | 6/1984 | Germany | H04N 3/15 |
| 3514994 | 10/1985 | Germany | H04N 3/15 |
| 3519077 | 12/1985 | Germany | H04N 3/15 |
| 3533922 | 4/1986 | Germany | H04N 3/15 |
| 3644266 | 7/1987 | Germany | H04N 3/15 |

OTHER PUBLICATIONS

Li et al.–Effect of Statistical Variation on Threshold Voltage in Narrow–Channel MOSFETs–Electronics Letters vol. 26 No. 7 Aug. 16, 1990.

*Primary Examiner*—Wendy Greening
*Assistant Examiner*—Andrew B. Christensen
*Attorney, Agent, or Firm*—Lowe, Price, LeBlanc & Becker

[57] ABSTRACT

An image sensor includes a photoelectric conversion element, a first MOS transistor having having a gate connected to the photoelectric conversion element, a second MOS transistor connected in series with the first transistor, and a third MOS transistor connected in series with the photoelectric conversion element, wherein the threshold voltage of the third MOS transistor is set higher than that of the second MOS transistor. In one embodiment, each of the pixels included in a second group of rows includes a photoelectric conversion element but without the first, second and third MOS transistors. A fourth MOS transistor connects a photoelectric conversion element of the second group to a photoelectric conversion element of a first group, the photoelectric conversion elements of the first group being part of pixels which contain first, second and third MOS transistors.

23 Claims, 34 Drawing Sheets

F I G. 25
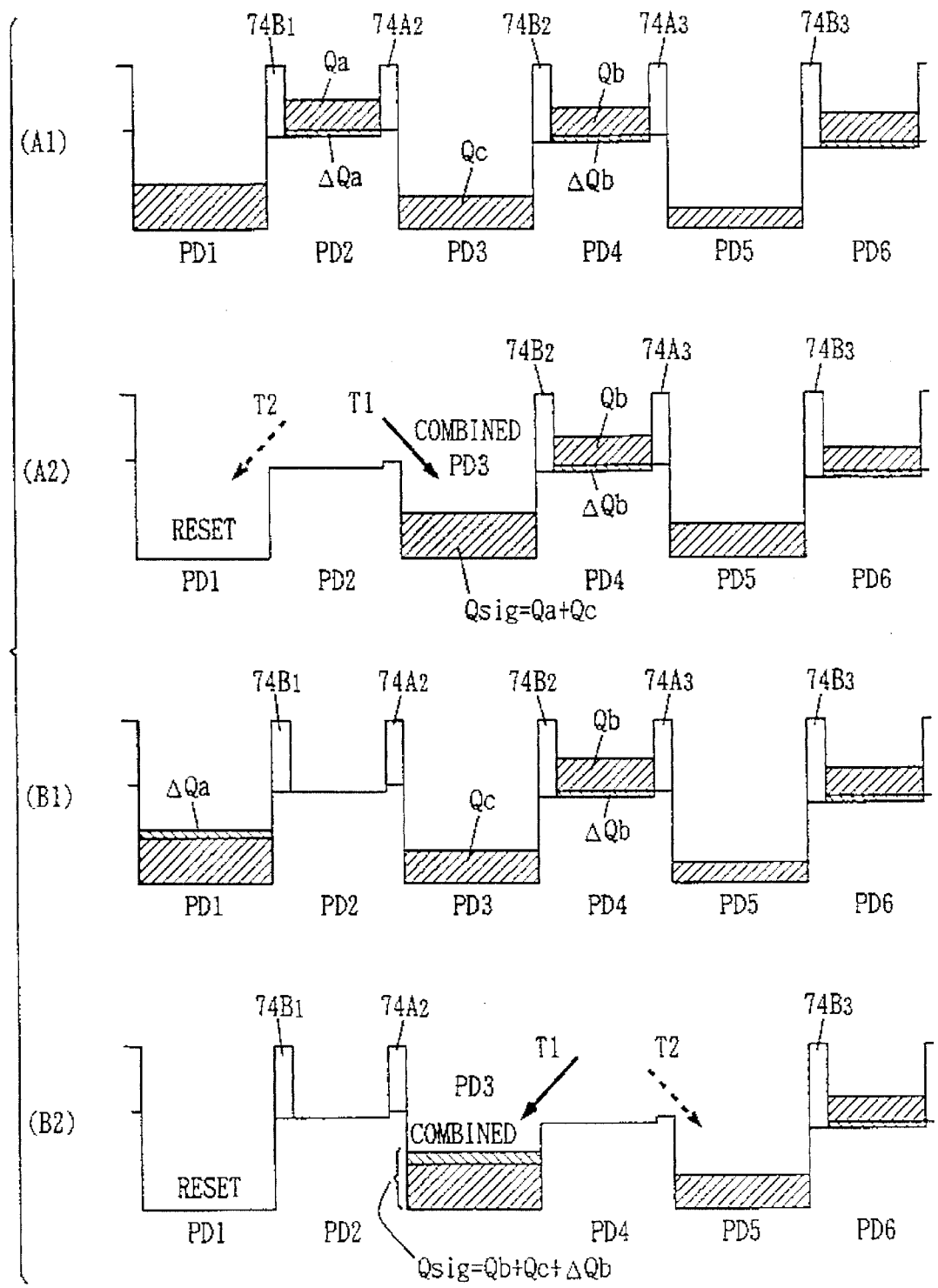

SOLID STATE IMAGE SENSOR AND A DRIVING METHOD THEREOF

BACKGROUND OF THE INVENTION

1. Field of the Invention

The present invention relates to a solid state image sensor, and more particularly, to improvement of an AMI (amplified MOS intelligent) type image sensor.

2. Description of the Background Art

Reflecting the increase in resolution of the horizontal direction and increase in density of recent image sensors, the area of one pixel is minimized in an image sensor, whereby the amount of incident light per 1 pixel is reduced. As a result, the intensity of a signal read out from an image sensor is decreased to lead to reduction of the S/N ratio. It is considered desirable to use an AMI type image sensor to overcome such problems.

FIG. 33 is a circuit diagram of a typical conventional AMI type image sensor. Referring to FIG. 23, an image sensor includes a photoelectric conversion element 31 formed by a PN junction, a MOS transistor 32 for amplification, a vertical-selection MOS transistor 33, an MOS transistor 34 for resetting photoelectric conversion element 31, a horizontal power supply line 35 for supplying power to a pixel including functional elements 31–34, a vertical-selection line 36 for selecting pixels disposed in the vertical direction, a vertical signal line 37 disposed in the vertical direction, a horizontal-selection MOS transistor 38 for selecting pixels arranged in the horizontal direction, a horizontal signal line 39, an I/V conversion amplifier 40 for converting signal current into voltage, a horizontal scanning circuit 41, and a vertical scanning circuit 42.

FIG. 34 is a circuit diagram for describing the operation of one arbitrary pixel in the image sensor of FIG. 33, and FIG. 35 is a timing chart for describing the operation of the pixel of FIG. 34. The signals in respective positions represented by various reference characters in FIG. 34 are denoted with the same reference characters in FIG. 35. In FIG. 35, a period 1H is one horizontal period in a general television system, a period H-BLK is a horizontal blanking period, and a period Read-Out corresponds to a signal reading period. Clocks V1 and H1 schematically represent clocks supplied to vertical scanning circuit 42 and horizontal scanning circuit 41, respectively.

At time T0, vertical-selection line 36 (VS) and horizontal power supply line 35 (VL) attain a high level, and transistors 32 and 33 are conductive. Since the output of photoelectric conversion element 31 is connected to the gate electrode of transistor 32, transistor 32 is conductive at an impedance depending upon an output potential $V_{pd}$ of photoelectric conversion element 31. At time T1 during a horizontal readout period Read-Out when signal Hi attains a high level to cause horizontal-selection MOS transistor 38 to attain a conductive state, vertical signal line 37 is electrically connected to I/V conversion amplifier, whereby a signal current corresponding to potential $V_{pd}$ of photoelectric conversion element 31 is read out as a voltage signal. At time T2 during the next horizontal period, vertical-selection line 45 (VR) of the subsequent row attains a high level, whereby photoelectric conversion element 31 is reset to a voltage level of Vreset supplied from horizontal power supply line 35 via MOS transistor 34. At time T3 of the next horizontal period, photoelectric conversion element 31 enters a storing mode that integrates a signal charge generated depending on incident light.

In a general interlace scanning operation of an image sensor, a first pixel group of alternate lines is scanned in a field A and a second pixel group of the other alternate lines is scanned in a field B.

In a conventional image sensor, reset of photoelectric conversion element 31 is carried out by vertical-selection line 36 of a subsequent row as shown in FIG. 33 in order to reduce the number of wirings disposed in a pixel array and to increase the integration density. In the image sensor of FIG. 33, the second pixel group will be reset during the scanning operation of the first pixel group in reading out field A, so that the signal charge in the second pixel group cannot be used. Similarly, the first pixel group will be reset during the scanning operation of the second pixel group in reading out field B, so that the signal charge of the first pixel group cannot be used. This means that the two-line-combined readout realized in a CCD image sensor to improve signal intensity is not possible in the AMI type image sensor of FIG. 33.

SUMMARY OF THE INVENTION

An object of the present invention is to provide an AMI type image sensor of high integration density that allows a two-line-combined readout, and a preferable driving method thereof.

An image sensor according to an aspect of the present invention includes a plurality of pixels, wherein each pixel includes a photoelectric conversion element, a first MOS transistor having a gate connected to the photoelectric conversion element, a second MOS transistor connected in series with the first MOS transistor, and a third MOS transistor connected in series with the photoelectric conversion element. The threshold voltage of the third MOS transistor is set higher than the threshold voltage of the second MOS transistor.

An image sensor according to another aspect of the present invention includes a plurality of pixels arranged in a matrix of a plurality of rows along the horizontal direction and a plurality of columns along the vertical direction. Each of the pixels in a first group of rows of alternate rows includes a photoelectric conversion element, a first MOS transistor having a gate connected to the photoelectric conversion element, a second MOS transistor connected in series with the first MOS transistor, and a third MOS transistor connected in series with the photoelectric conversion element. Each of the pixels in a second group of rows of the other alternate rows includes a photoelectric conversion element. Further provided is a fourth MOS transistor that connects a photoelectric conversion element of the first group and a photoelectric conversion element of the second group adjacent in a column.

According to a method of driving an image sensor including a plurality of pixels arranged in a matrix of a plurality of rows in the horizontal direction and a plurality of column in the vertical direction, wherein each of the pixels in a first group of rows of alternate rows includes a photoelectric conversion element, a first MOS transistor having a gate connected to the photoelectric element, a second MOS transistor connected in series with the first MOS transistor, and a third MOS transistor connected in series with the photoelectric conversion element, and each of the pixels in a second group of rows of the other alternate rows includes a photoelectric element, and further including a fourth MOS transistor for connecting a photoelectric conversion element of a first group to an adjacent photoelectric conversion element of a second group in a column, said method including the steps of: rendering conductive a fourth MOS transistor of a selected row, combining within a photoelectric conversion element of the first group the signal charge stored in the first and second groups of photoelectric conversion elements connected to the selected fourth MOS transistor, rendering conductive the other fourth MOS transistor connected to each photoelectric conversion element of the second group connected to the selected fourth MOS transistor, and reading out the charge combined in the photoelectric conversion element of the first group connected to the row of the selected fourth MOS transistor.

A method of driving an image sensor according to another aspect of the present invention includes the steps of: rendering conductive a fourth MOS transistor of a selected row, combining within a photoelectric conversion element of a first group the signal charge stored in photoelectric conversion elements of first and second groups connected to a selected fourth MOS transistor, rendering conductive the fourth MOS transistor of a row subsequent to the row selected in the forward direction of vertical scanning of the fourth MOS transistor, combining within the photoelectric conversion element of the first group the signal charge stored in the photoelectric conversion elements of the first and second groups connected to the fourth MOS transistor of the subsequent row, rendering conductive the other fourth MOS transistor connected to each photoelectric conversion element of the first group connected to the fourth MOS transistor of the selected row, and reading out the charge combined within the photoelectric conversion element of the first group connected to the row of the selected fourth MOS transistor.

A method of driving an image sensor according to a further aspect of the present invention includes the steps of: rendering conductive a fourth MOS transistor of a selected i-th row, combining within a photoelectric conversion element of a j-th row the signal charge stored in a photoelectric conversion element of the first group of the j-th row and a photoelectric conversion element of the second group of a the k-th row connected to the fourth MOS transistor of the i-th row, rendering conductive the two fourth MOS transistors connected to the sides of the photoelectric conversion element of the first group of the (j–1)th row, and reading out the charge combined in the photoelectric conversion element of the first group of the j-th row, where i, j and k represent the row number of the fourth MOS transistor in the forward direction of a vertical scanning operation, the row number of the photoelectric conversion elements of the first group, and the row number of the photoelectric conversion elements of the second group, respectively.

According to a method of driving an image sensor including a plurality of pixels arranged in a matrix of a plurality of rows in the horizontal direction and a plurality of columns in the vertical direction, wherein each of the pixels in a first group of rows of alternate rows includes a photoelectric conversion element, a first MOS transistor having a gate connected to the photoelectric conversion element, a second MOS transistor connected in series with one conductive terminal of the first MOS transistor, a power supply line connected to the other conductive terminal of the first MOS transistor, and a third MOS transistor connected in series with the photoelectric conversion element, and each of the pixels in a second group of rows of the other alternate rows includes a photoelectric conversion element, and further including a fourth MOS transistor for connecting a photoelectric conversion element of the first group to an adjacent photoelectric conversion element of the second group in a column, said method including the step of, when a fourth MOS transistor of a selected row is rendered conductive, setting the potential of a first power supply line connected to a first MOS transistor having the gate connected to a photoelectric conversion element of the first group connected to a selected fourth MOS transistor equal to the potential of second and third power supply lines adjacent at one side and the other side of the first power supply line.

In the image sensor according to the one aspect of the present invention, two-line-combined readout is allowed without degrading the integration density because the threshold voltage of the third MOS transistor is set higher than that of the second MOS transistor.

In the image sensor according to the another aspect of the present invention, the fourth MOS transistor allows a two-line-combined readout. The fourth MOS transistor can be formed with almost no additional semiconductor region between a photoelectric conversion element of the first group and a photoelectric conversion element of the second group.

According to the method of driving an image sensor, flickers between fields on a display screen can be reduced because charge remaining in a photoelectric conversion element of the second group is swept out after the signal charge in a photoelectric conversion element of the second group is combined into a photoelectric conversion element of the first group.

According to the method of driving an image sensor of the other aspect of the present invention, field flicker caused by capacitive coupling is reduced since the plurality of power supply lines in the proximity of a fourth MOS transistor are set to the same potential when that fourth MOS transistor of a selected line is rendered conductive.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a potential diagram illustrating an operation realized by the timing chart of FIG. 24 similar to FIG. 23.

DESCRIPTION OF THE PREFERRED EMBODIMENTS

Figure 1:
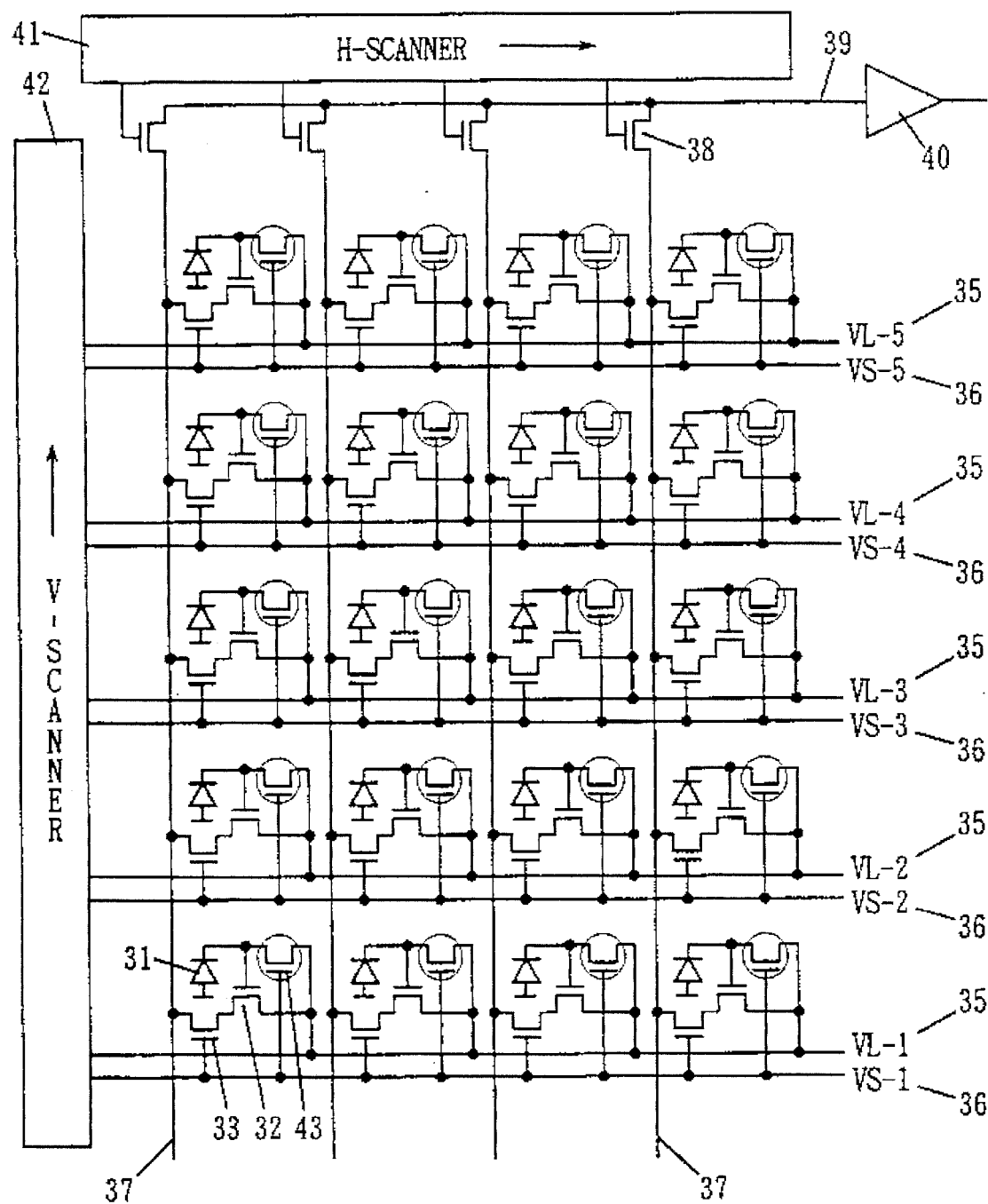
FIG. 1 is a circuit diagram schematically showing an image sensor according to an embodiment of the present invention.

FIG. 1 schematically illustrates an image sensor according to an embodiment of the present invention. Many components of the image sensor of FIG. 1 are similar to those of a conventional image sensor shown in FIG. 21, and corresponding components have the same reference characters denoted. It is to be noted that, in the image sensor of FIG. 1, the gate electrode of MOS transistor 43 used for resetting photoelectric conversion element 31 is connected to vertical-selection line 36 for selecting a row to which that photoelectric conversion element 31 belongs. The threshold voltage of reset MOS transistor 43 is set higher than that of vertical-selection MOS transistor 33.

Figure 2:
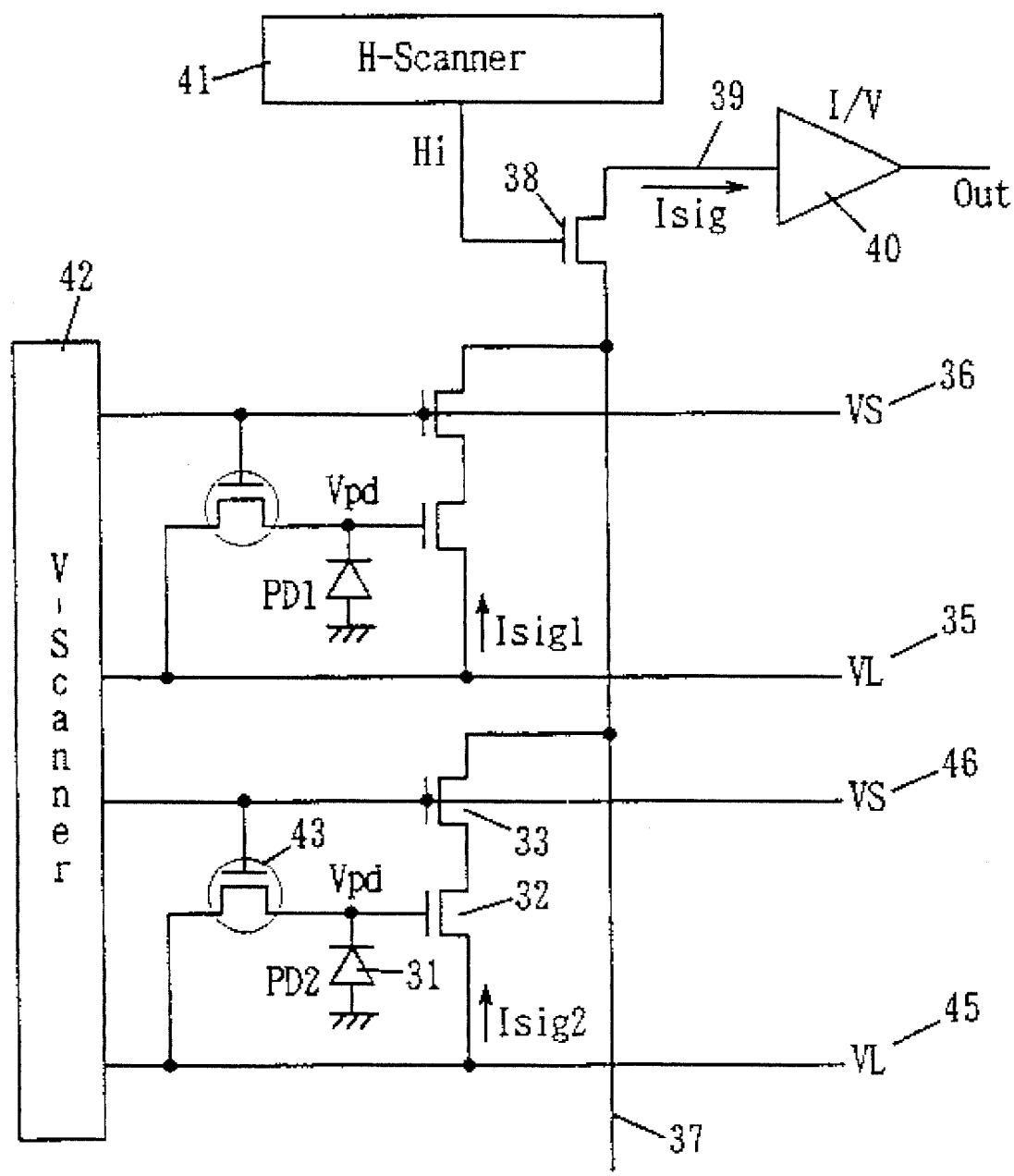
FIG. 2 is a partial circuit diagram for describing an operation of the image sensor of FIG. 1.
Figure 3:
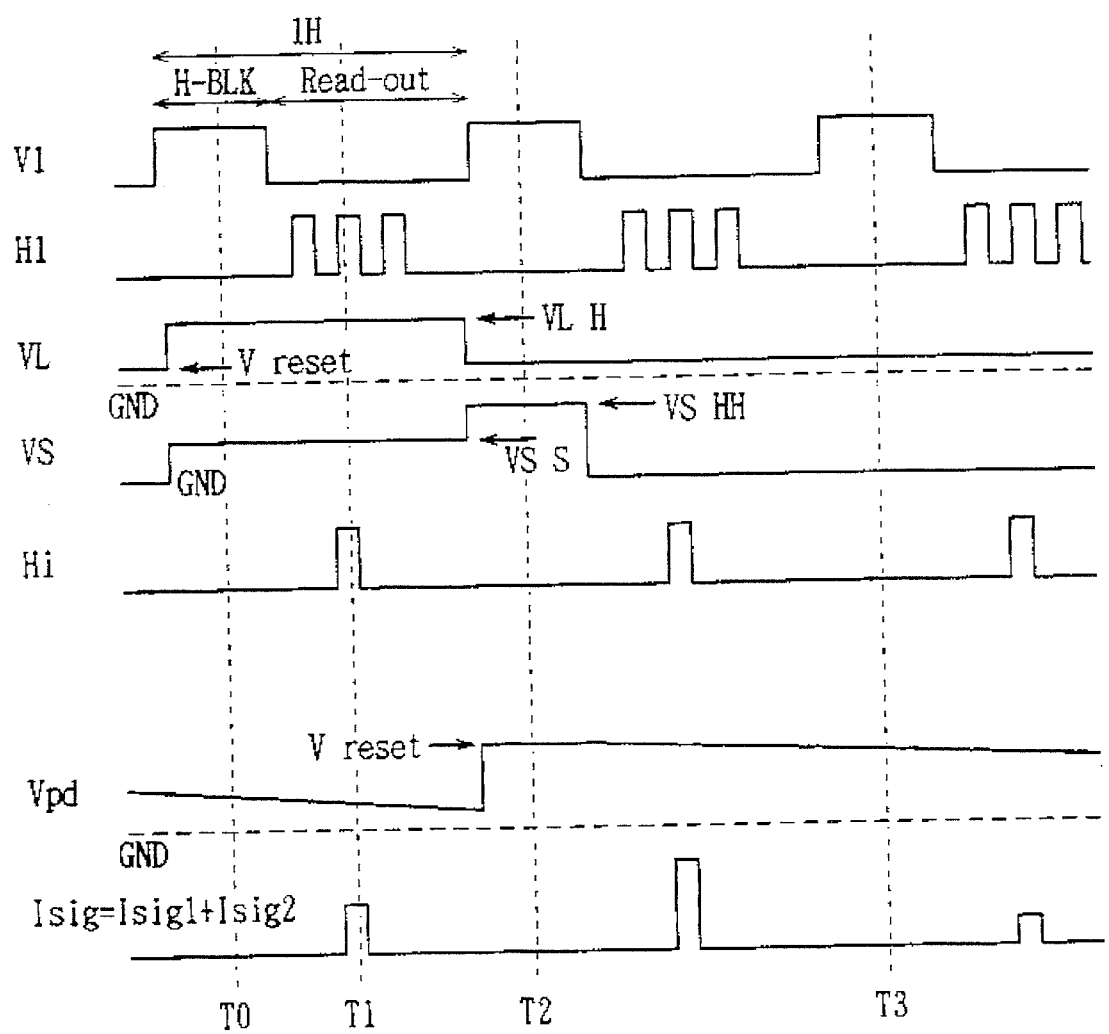
FIG. 3 is a timing chart for controlling the operation of the image sensor shown in FIG. 2.

FIG. 2 is a diagram for describing the operation of two adjacent pixels in one column in the image sensor of FIG. 1, and FIG. 3 is a timing chart for describing the operation of the two pixels shown in FIG. 2. At time T0, two rows of vertical-selection lines 36 and 46 (VS) and two rows of horizontal power supply lines 35 and 45 (VL) are selected. Reset MOS transistor 43 does not operate at the time of vertical-selection since it has a threshold voltage Vth that is not turned on at the selection level of VSS. When horizontal readout MOS transistor 38 is selected at time T1 during the next horizontal readout period Read-Out, vertical-selection line 37 is electrically connected to I/V conversion amplifier 40 via horizontal signal line 39, whereby a signal current is read out. Because the input impedance of I/V conversion amplifier 40 is sufficiently lower than the output impedance of the pixel circuit, signal currents Isig1 and Isig2 from photoelectric conversion elements PD1 and PD2 are summed and read out. At time T2 in the next horizontal period when vertical-selection line 36 and 46 attain a level of VSHH, and reset transistor 43 is ON, potential Vpd of photoelectric conversion elements PD1 and PD2 are reset to the level of Vreset by horizontal power supply lines 35 and 45 (VL). At time T3 during the next horizontal period, these two pixels attain a de-select state, i.e. a storing state for integrating the signal charge.

By setting the threshold voltage Vth of reset MOS transistor 43 of photoelectric conversion element 31 (PD) to a level that does not turn on transistor 43 at the time of row selection, and applying a potential of high level that turns on transistor 43 completely at the time of reset, the storing time of each pixel can be controlled independent of a readout of an adjacent pixel. Thus, combining signals of two rows for readout is possible.

Figure 4:
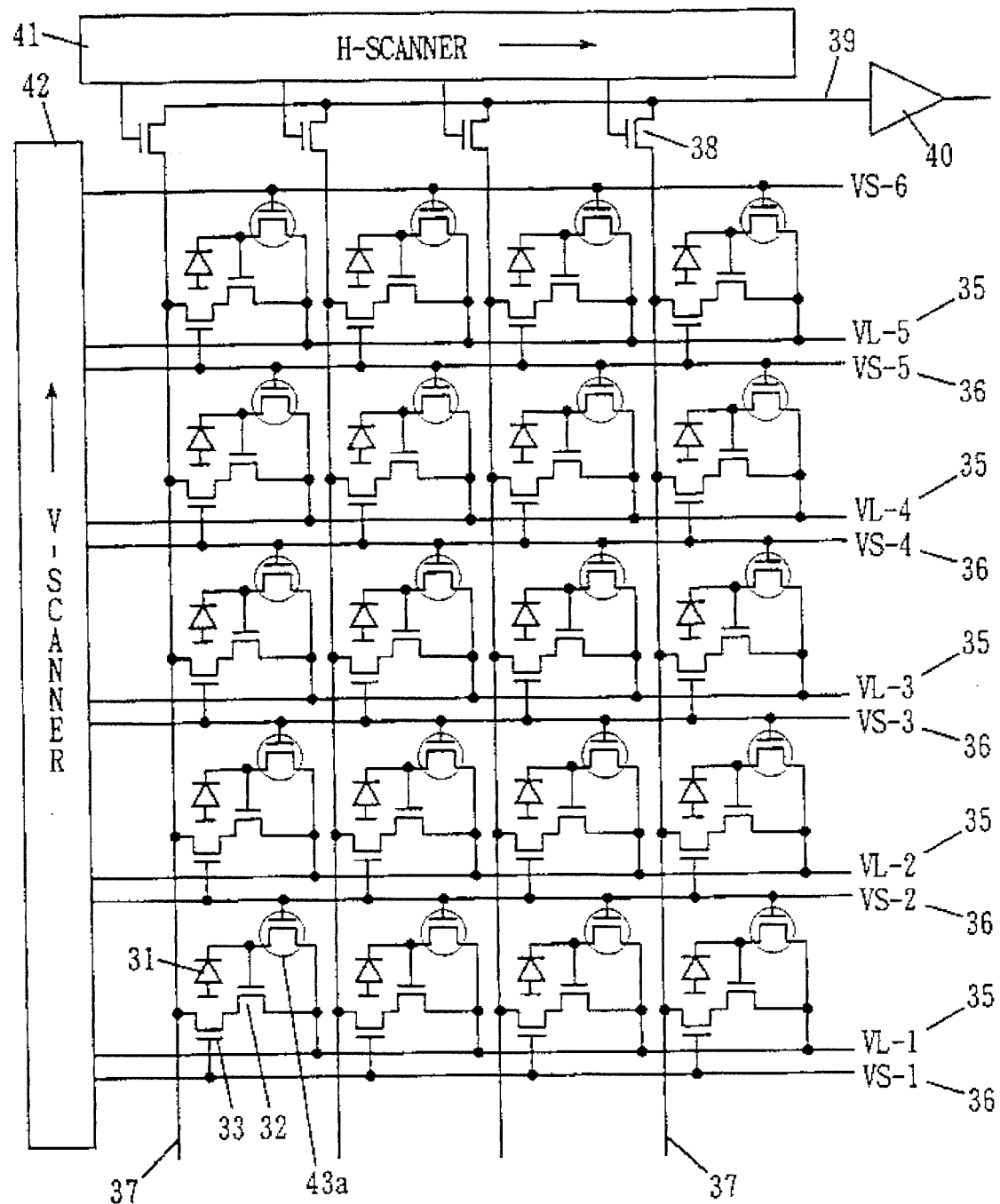
FIG. 4 is a circuit diagram schematically showing an image sensor according to another embodiment of the present invention.

FIG. 4 schematically shows an image sensor according to another embodiment of the present invention. The image sensor of FIG. 4 is similar to that of FIG. 1 except for the gate electrode of a reset MOS transistor 43a being connected to an adjacent pixel selection line 36. Similar to the above-described embodiment, MOS transistor 43a has a high threshold voltage Vth. The readout of the signal in the image sensor of FIG. 4 is similar to that already described with reference to FIG. 3. Vertical scanning circuit 42 is driven with only the method of applying a reset clock changed so as to select a reset MOS transistor 43a of a pixel to be reset.

Figure 5:
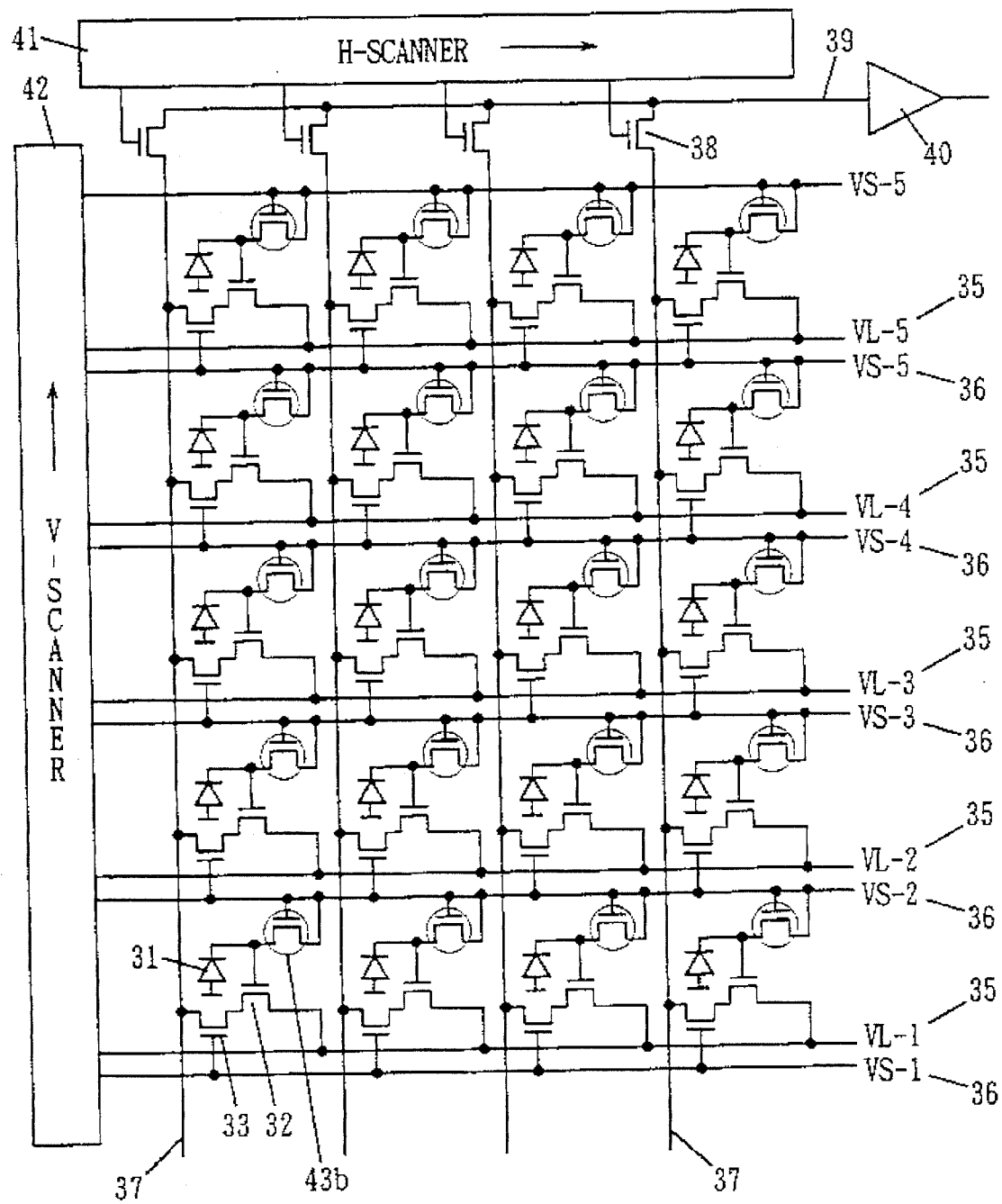
FIG. 5 is a circuit diagram schematically showing an image sensor according to a further embodiment of the present invention.

FIG. 5 schematically shows an image sensor according to a further embodiment of the present invention. The image sensor of FIG. 5 is also similar to that of FIG. 1, except for the gate and drain terminals of reset MOS transistor 43b being connected in common to an adjacent vertical-selection line 36. Reset MOS transistor 43b has a high threshold voltage Vth similar to that of the above-described embodiment. The operation of the image sensor of FIG. 5 is also similar to that already described with reference to FIG. 3, provided that reset level Vreset is set to a value represented by the following equation.

$$Vreset = VSHH - Vthr$$

Vthr is the threshold voltage of reset MOS transistor 43b and VSHH is the potential of vertical-selection line 36 at the time of reset. In contrast to the embodiments of FIGS. 1 and 4 in which reset potential Vreset is set at a low level of horizontal power supply line 35, control of the low level Vreset of horizontal power supply line 35 is not necessary since the reset level can be determined with the VSHH level of vertical-selection line 36 in the embodiment of FIG. 5.

Figure 6:
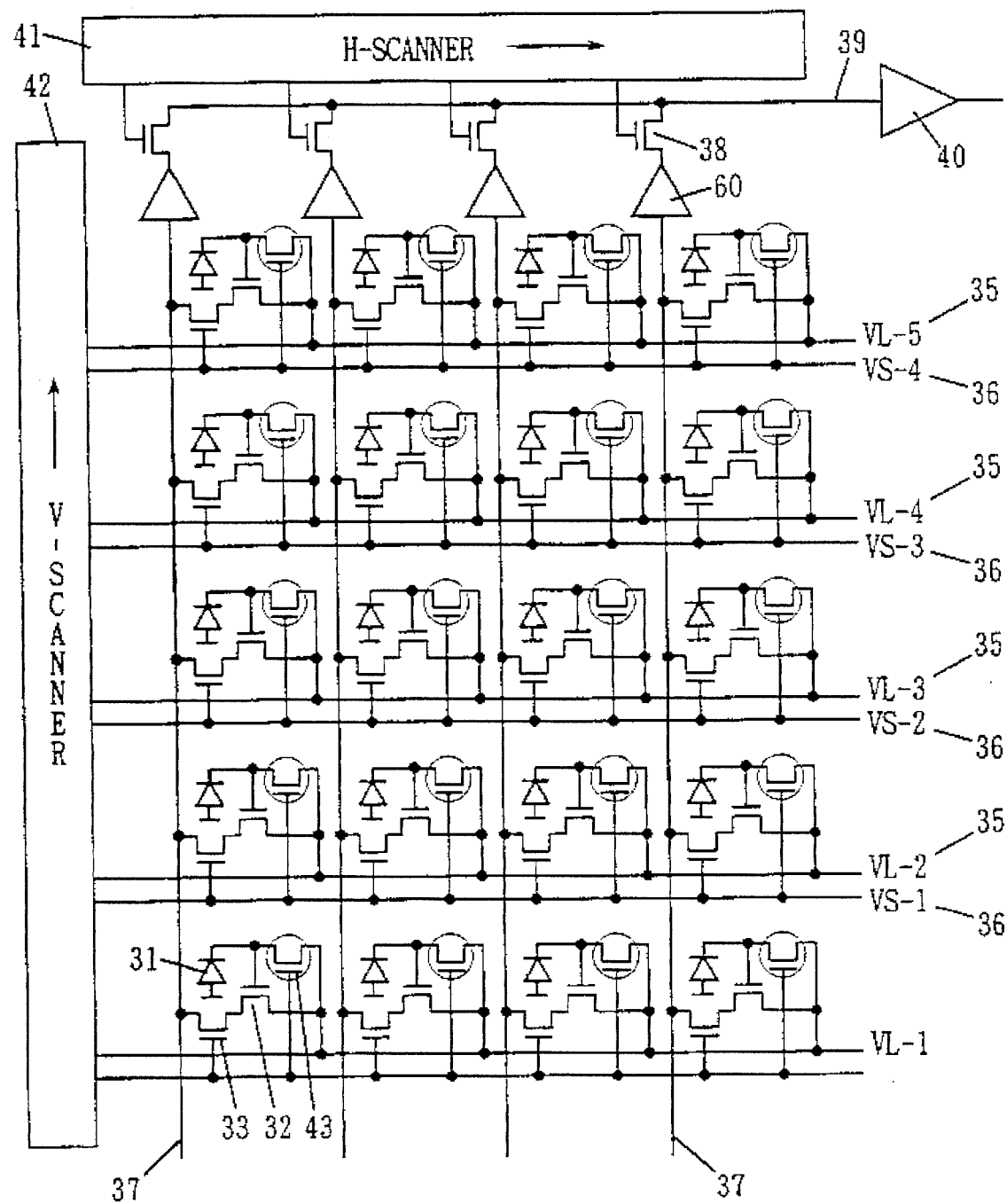
FIG. 6 is a circuit diagram schematically showing an image sensor according to still another embodiment of the present invention.

FIG. 6 schematically shows an image sensor according to still another embodiment of the present invention. The image sensor of FIG. 6 is similar to that of FIG. 1, except for vertical signal line 37 being connected to horizontal-selection MOS transistor 38 via an additional low input impedance amplifier 60. In the above-described embodiments, combining signals of two rows is carried out by I/V conversion amplifier 40. Because signals of two rows are combined by I/V conversion amplifier 40 via the ON resistance of horizontal-selection MOS transistor 38, there is a disadvantage of the readout speed being reduced or degradation in the accuracy of signal combination caused by interference between the two rows. These problems can be solved by providing an amplifier 60 of low input impedance as a buffer in each vertical signal line 37.

Figure 7:
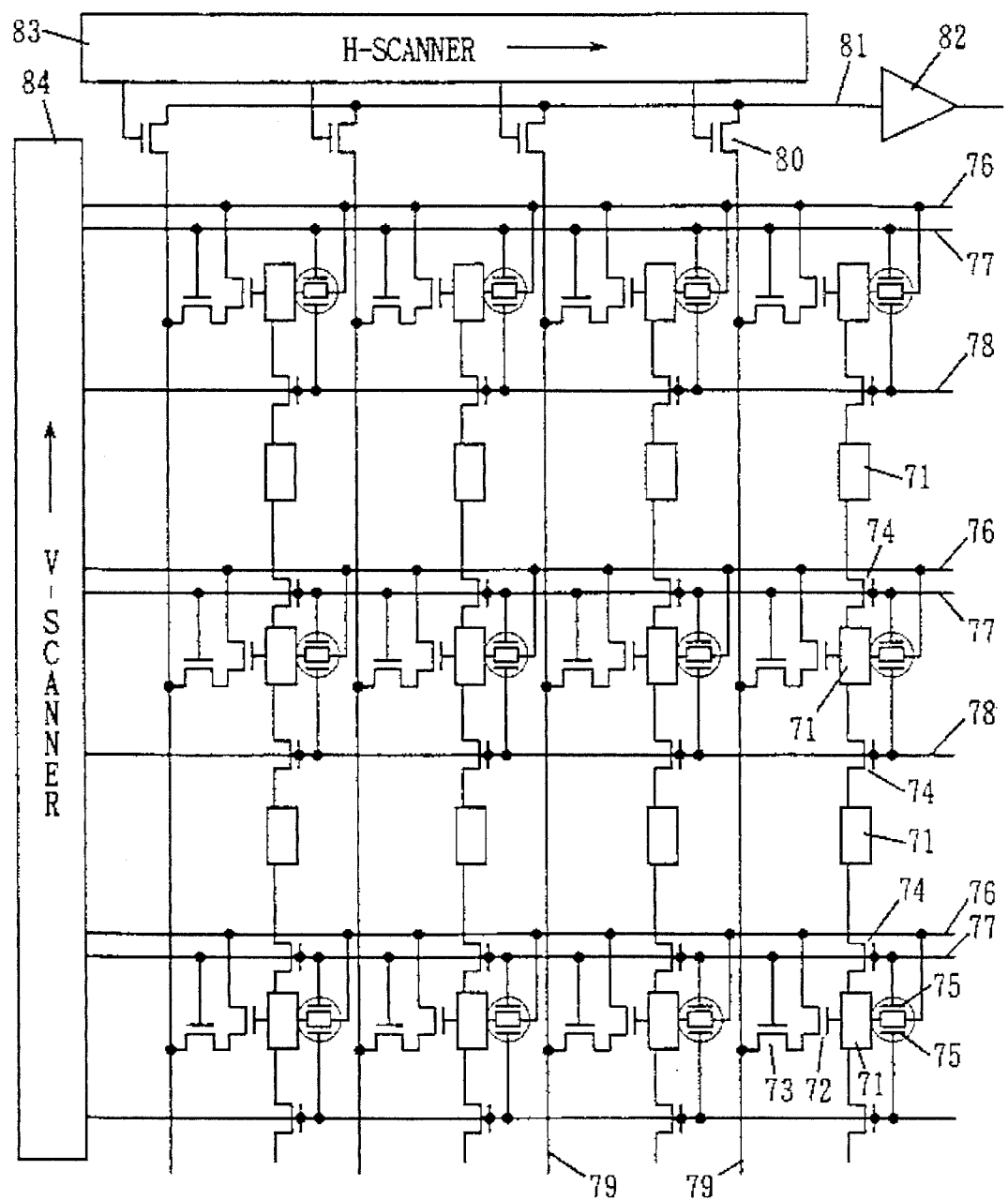
FIG. 7 is a circuit diagram schematically showing an image sensor according to a still further embodiment of the present invention.

FIG. 7 schematically shows an image sensor according to a still further embodiment of the present invention. In the above-described embodiments, signals of two rows are combined on vertical signal line 79. In the image sensor of the present embodiment, signals of two rows are combined in an adjacent photoelectric conversion element, and then read out. Referring to FIG. 7, the image sensor includes a photoelectric conversion element 71 formed by, for example, a PN junction, a MOS transistor 72 for amplification, a vertical-selection MOS transistor 73, a MOS transistor 74 for combining the signal charge of an adjacent photoelectric conversion element, a double MOS transistor 75 used for resetting photoelectric conversion element 71 and having a high threshold voltage Vth, a horizontal power supply line 76 for applying power supply to a pixel, a vertical-selection line 77 for selecting a pixel arranged in the vertical direction, a control line 78 for combining the signal charge of an adjacent photoelectric conversion element 71, a vertical signal line 79 disposed in the vertical direction, a horizontal MOS transistor 80 for selecting pixels arranged in the horizontal direction, a horizontal signal line 81, an I/V conversion amplifier 82 for converting signal current into voltage, a horizontal scanning circuit 83, and a vertical scanning circuit 84.

Figure 8:
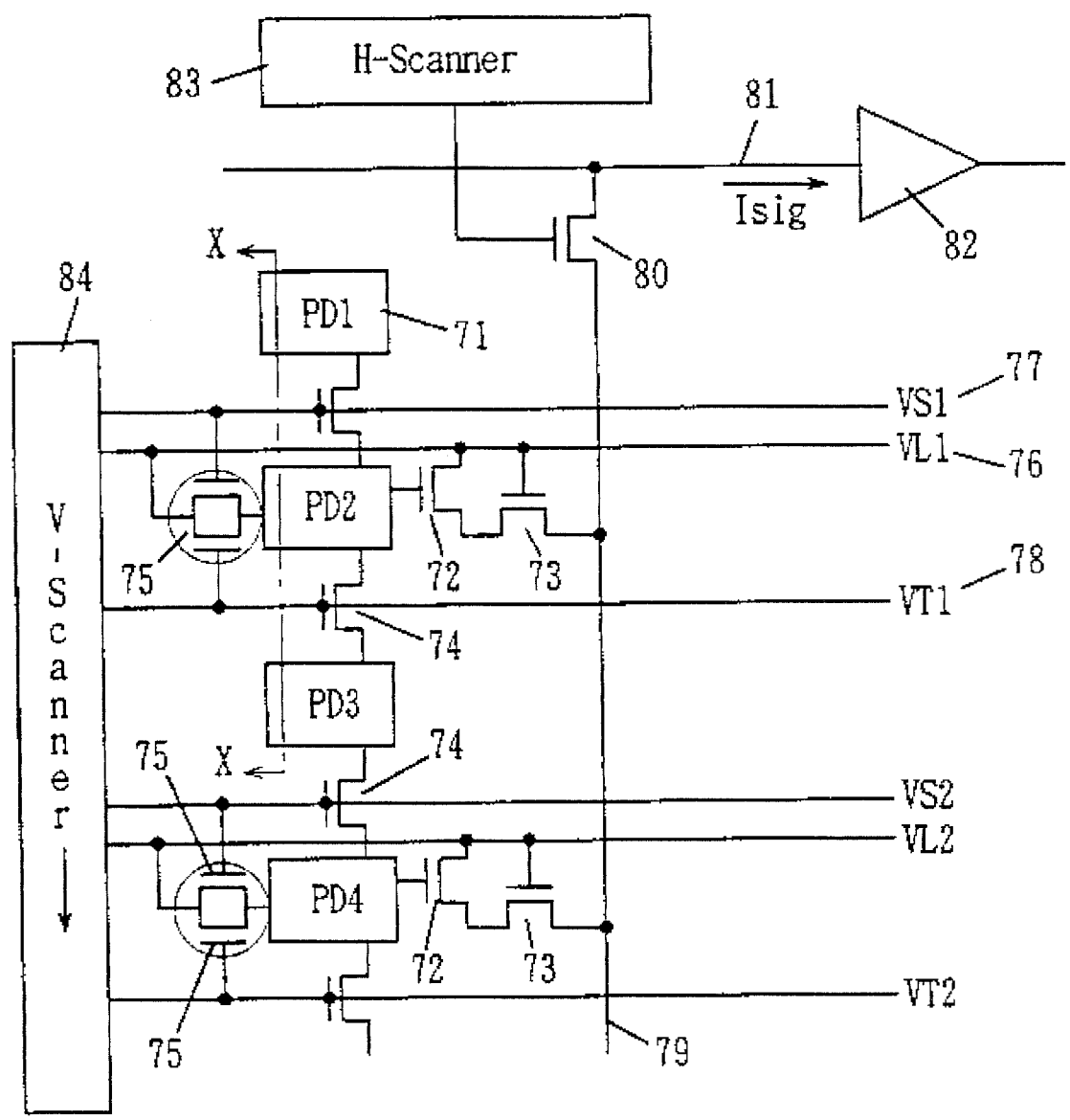
FIG. 8 is a partial circuit diagram for describing an operation of the image sensor of FIG. 8.
Figure 9:
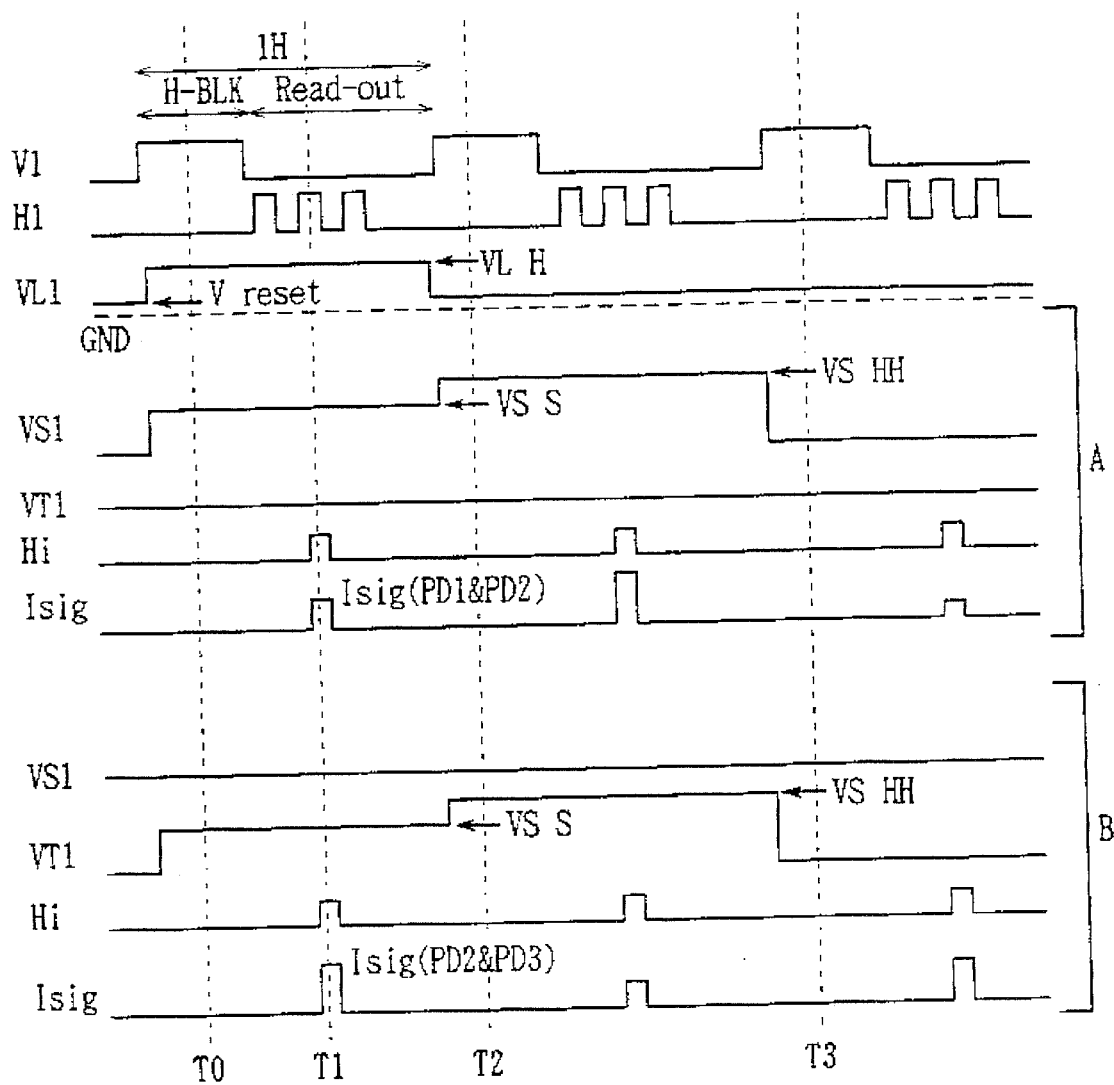
FIG. 9 is a timing chart for controlling the operation of the image sensor shown in FIG. 8.

FIG. 8 shows four continuous pixels in one column for describing an operation of the image sensor of FIG. 7. FIG. 9 is a timing chart for describing the operation of the pixels in FIG. 8. In the scanning operation of field A, horizontal power supply line VL1 is set to a high level VLH and vertical-selection line VS1 is set to an intermediate level of VSS at time T0. Here, MOS transistor 74 between photoelectric conversion elements PD1 and PD2 conducts, whereby the signal charge stored in respective photoelectric conversion elements are combined. When horizontal selection MOS transistor 80 is selected at time T1 during a horizontal readout period Read-Out, vertical signal line 79 is electrically connected to I/V conversion amplifier 82, whereby signal current is read out. At time T2 of the next horizontal period, vertical-selection line VS1 is boosted to the high level of VSHH, whereby reset MOS transistor 75 conducts to reset photoelectric conversion elements PD1 and PD2 to a low level of Vreset of vertical power supply line VL1. At time T3 of the next horizontal period, selection line VS1 attains a low level and photoelectric conversion elements PD1 and PD2 initiate charge storage.

The scanning operation of field B is similar to that of Field A. At time T0, horizontal power supply line VL1 is set to a high level of VLH, and pixel combine control line VT1 is set to an intermediate level VSS. Here, transistor 74 between photoelectric conversion elements PD2 and PD3 conducts, whereby the signal charge stored in respective photoelectric conversion elements are combined. When horizontal-selection MOS transistor 80 is selected at time T1 during horizontal readout period Read-Out, vertical signal line 79 is electrically connected to I/V conversion amplifier 82, whereby signal current is read out. At time T2 of the next horizontal period, combine control line VT1 is boosted from the intermediate level VSS to a high level VSHH to render reset MOS transistor 75 conductive, whereby photoelectric conversion elements PD2 and PD3 are reset to low level Vreset of vertical power supply line VL1. At time T3 of a subsequent horizontal period, selection line VS1 and control line VT1 attain a low level, whereby photoelectric conversion elements PD2 and PD3 initiate charge storage.

In the image sensor of FIG. 7, the pairs of photoelectric conversion elements PDs can be changed between the scanning operations of field A and B. More specifically, two-line-combined readout is allowed in interlace scanning. In the present embodiment, signal readout of high speed and accuracy can be carried out since signal combination on signal line 37 is not required as in the above-described embodiments.

Figure 10:
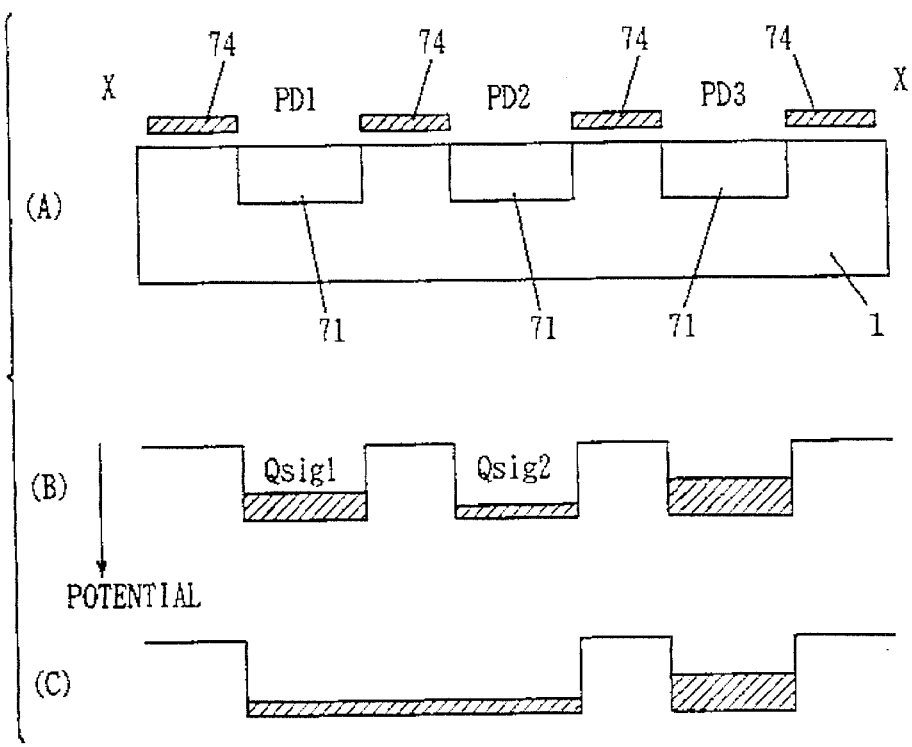
FIG. 10 is a schematic diagram of the image sensor of FIG. 8 taken along line X—X for describing an example of a sectional structure.

FIG. 10 is a sectional view of the image sensor of FIG. 8 taken along line X—X for describing an example of the sectional structure thereof. Referring to FIG. 10, the structure of the image sensor of (A) includes a semiconductor substrate 1 of, for example, P type, a photoelectric conversion element 71 including impurities of, for example, N type, and an MOS transistor 74 for controlling the combining of two pixels adjacent in the column direction. (B) schematically shows the energy potential of photoelectric conversion elements PD1–PD3 under a storing state of signal charge. Signal charge Qsig1 is stored in photoelectric conversion element PD1, and signal charge Qsig2 is stored in photoelectric conversion element PD2. (C) shows the potential when pixel signals are being combined. The potential Vg of the gate electrode of amplification MOS transistor 72 after pixel combining is expressed by the following equation.

$$\begin{aligned} Vg &= (Qsig1 + Qsig2)/(Cpd + Cpd) \\ &= (Vsig1 \times Cpd + Vsig2 \times Cpd)/2 \times Cpd \\ &= (Vsig1 + Vsig2)/2 \end{aligned}$$

Cpd represents the parasitic capacitance of a photoelectric conversion element, and Vsig1 and Vsig2 represent the potentials of photoelectric conversion elements PD1 and PD2 prior to pixel combining. According to this equation, gate potential Vg of amplification MOS transistor 72 in the image sensor of FIG. 8 with the structure shown in FIG. 10 becomes the average value of the two combined photoelectric elements, implying that gate potential Vg determining the amplification factor is substantially equal to that prior to signal charge combination.

Figure 11:
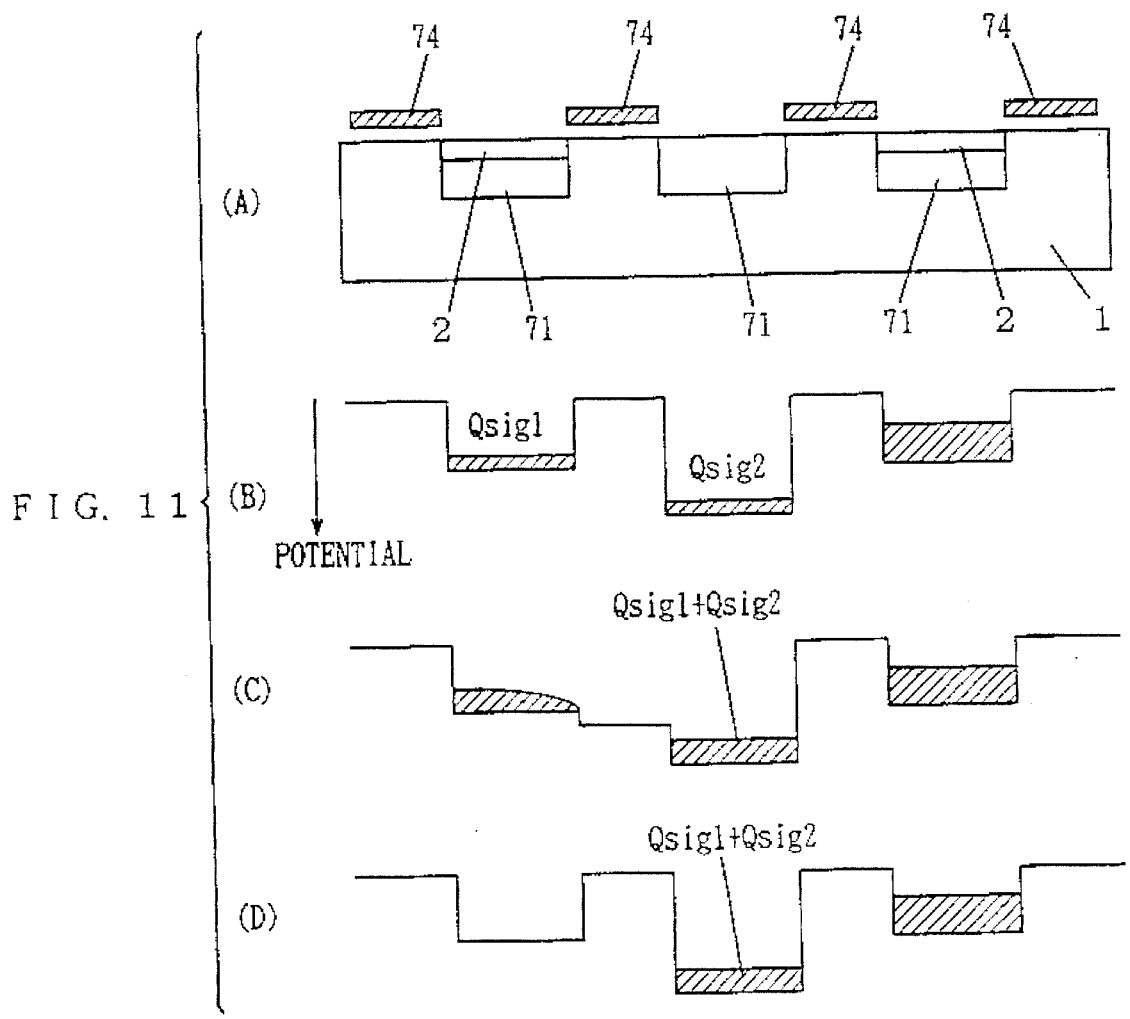
FIG. 11 is a schematic diagram for describing another sectional structure which is an alternative of the sectional structure shown in FIG. 10.

FIG. 11 shows another sectional structure alternative of that shown in FIG. 10. The structure of FIG. 11 (A) is similar to that of FIG. 10 (A), provided that an additional thin impurity layer 2 is formed at the surface of semiconductor photoelectric elements PD1 and PD3. Additional impurity layer 2 has a type of conductivity (for example P type) opposite to that of the photoelectric conversion element (for example N type).

FIG. 11 (B) shows the potential diagram of photoelectric conversion elements PD1–PD3 realized by the structure of FIG. 11 (A). Photoelectric conversion elements PD1 and PD3 are completely depleted at the time of reset due to the existence of impurity layer 2 of an opposite conductivity type, whereby the potential is fixed to a constant value. The potential of photoelectric conversion element PD2 without the opposite conductivity type impurity layer 2 can be controlled by the drain voltage of reset MOS transistor 75, and is set deeper than the potential of photoelectric conversion elements PD1 and PD3.

When the signal charge are combined between photoelectric conversion elements PD1 and PD2, MOS transistor 74 between photoelectric conversion elements PD1 and PD2 are turned on, and signal charge Qsig1 is transferred from photoelectric conversion element PD1 of shallow potential to photoelectric conversion element PD2 of deep potential, as shown in FIG. 11 (C).

Referring to FIG. 11 (D), when MOS transistor 74 between photoelectric conversion elements PD1 and PD2 is turned off, signal charge of two rows Qsig1+Qsig2 is stored in photoelectric conversion element PD2 of deep potential. Gate potential Vg' of amplification MOS transistor 72 is represented by the following equation.

$$Vg' = (Qsig1 + Qsig2)/Cpd$$
$$= Vsig1 + Vsig2$$

It is appreciated that the change of gate potential Vg' corresponds to the addition of the potential changes of two pixels, whereby the channel conductance of amplify MOS transistor 72 shows a great change. Therefore, the combined effect of signal charge of two pixels can be used effectively. Photoelectric conversion element PD1 of shallow potential is completely depleted again after charge transfer to be fixed to the potential shown in FIG. 11 (D), whereby charge storage is initiated again.

Figure 12:
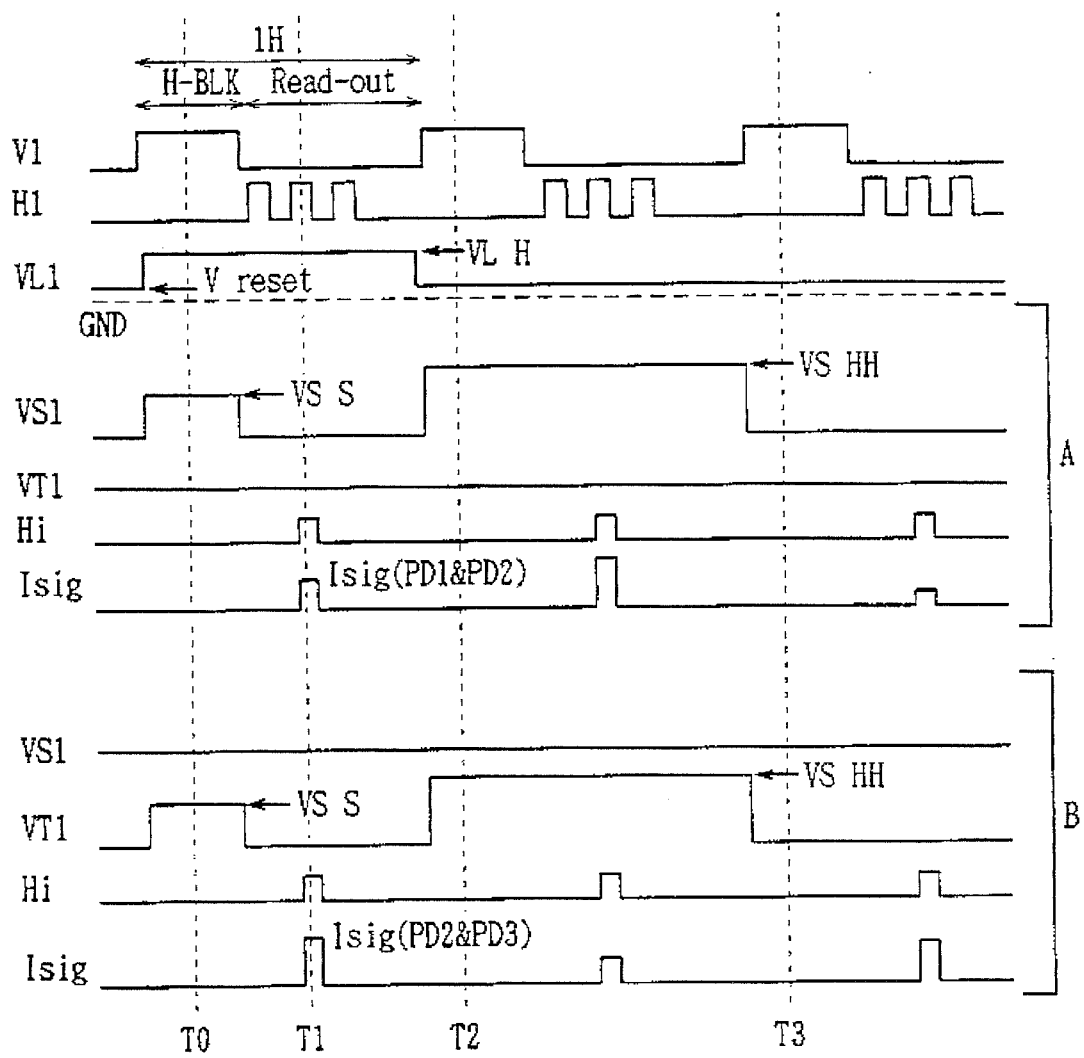
FIG. 12 is a timing chart for controlling the operation of the image sensor with the structure of FIG. 11.

FIG. 12 is a timing chart for realizing the operation described with reference to FIG. 11. At time T0, adjacent photoelectric conversion elements have their charge combined, and then read out at time T1. At time T2, the photoelectric conversion elements are reset.

In order to provide potential difference between adjacent photoelectric conversion elements, a combination is employed of completely depleted photoelectric conversion elements (such as PD1, PD3) and a general photoelectric conversion element (such as PD2) in the structure of FIG. 11 (A). When all the photoelectric conversion elements are formed of completely depleted photoelectric conversion elements, potential difference between adjacent photoelectric conversion elements can also be provided by changing the impurity concentration of the conductive type impurity layer or the photoelectric conversion element.

Figure 13:
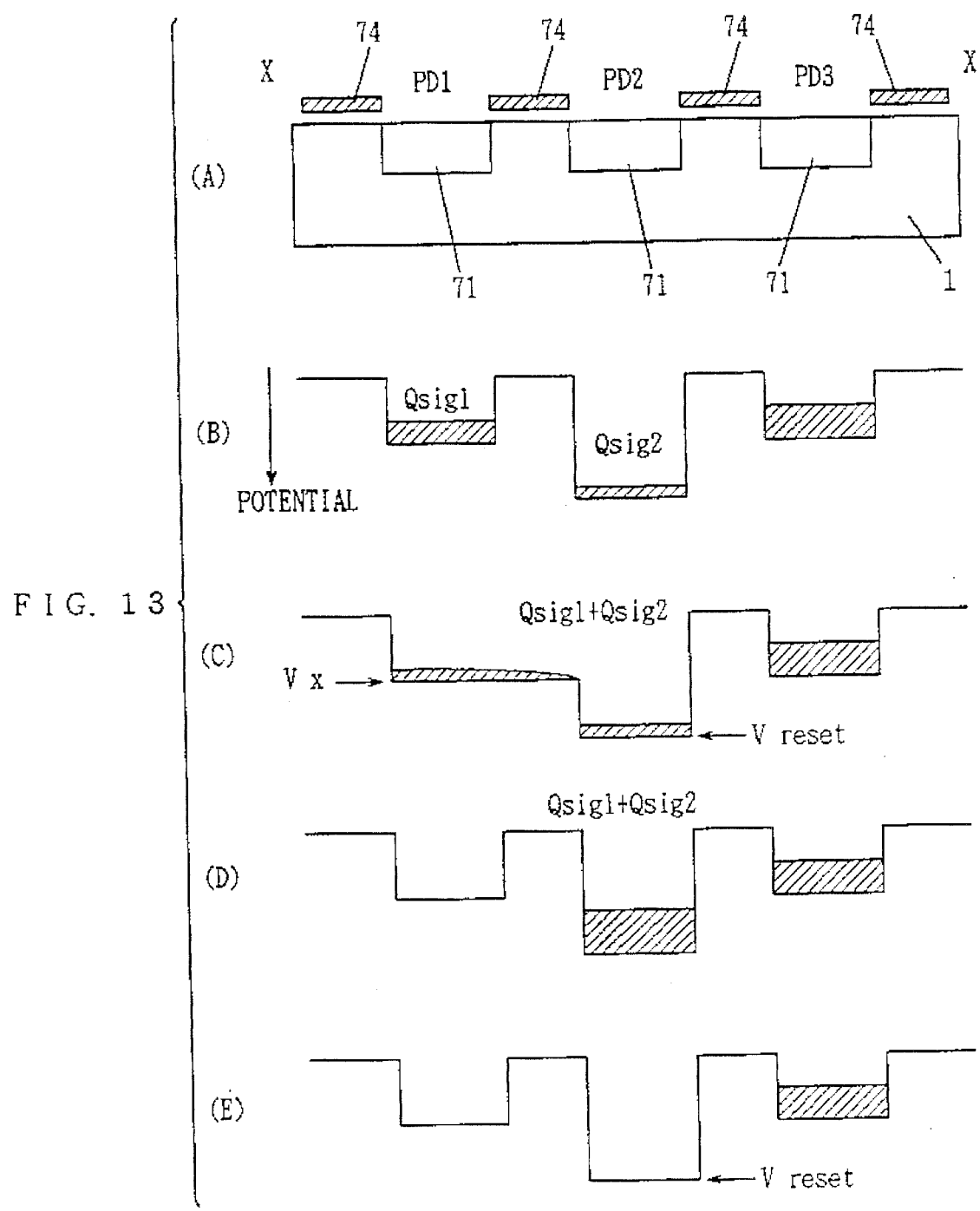
FIG. 13 is a diagram for describing another operation according to the structure of FIG. 10(A).

The operation described with reference to (B)–(D) in FIG. 11 is also possible in the image sensor having the structure of FIG. 10 (A). This is illustrated in FIG. 13, where (A) shows a structure similar to that of FIG. 10 (A). The operations shown in (B)–(D) of FIG. 13 correspond to (A)–(D) of FIG. 11, and FIG. 11 (E) shows a state after reset.

The reset level of photoelectric conversion elements PD1 and PD3 is determined by potential Vx formed by the potential of gate electrode 74 (refer to FIG. 13 (C)). The reset level of photoelectric conversion element PD2 is determined by the reset potential of Vreset of MOS transistor 75, and is set to a level sufficiently deeper than the potential specified in photoelectric conversion elements PD1 and PD3. Therefore, charges greater than potential Vx established by gate 74 attaining a high level are read out from photoelectric conversion elements PD1 and PD3. The operation shown in (B)–(E) of FIG. 13 can be realized by adjusting the level of a driving clock or the like so as to specify the potential of each photoelectric conversion element at the time of reset.

Figure 14:
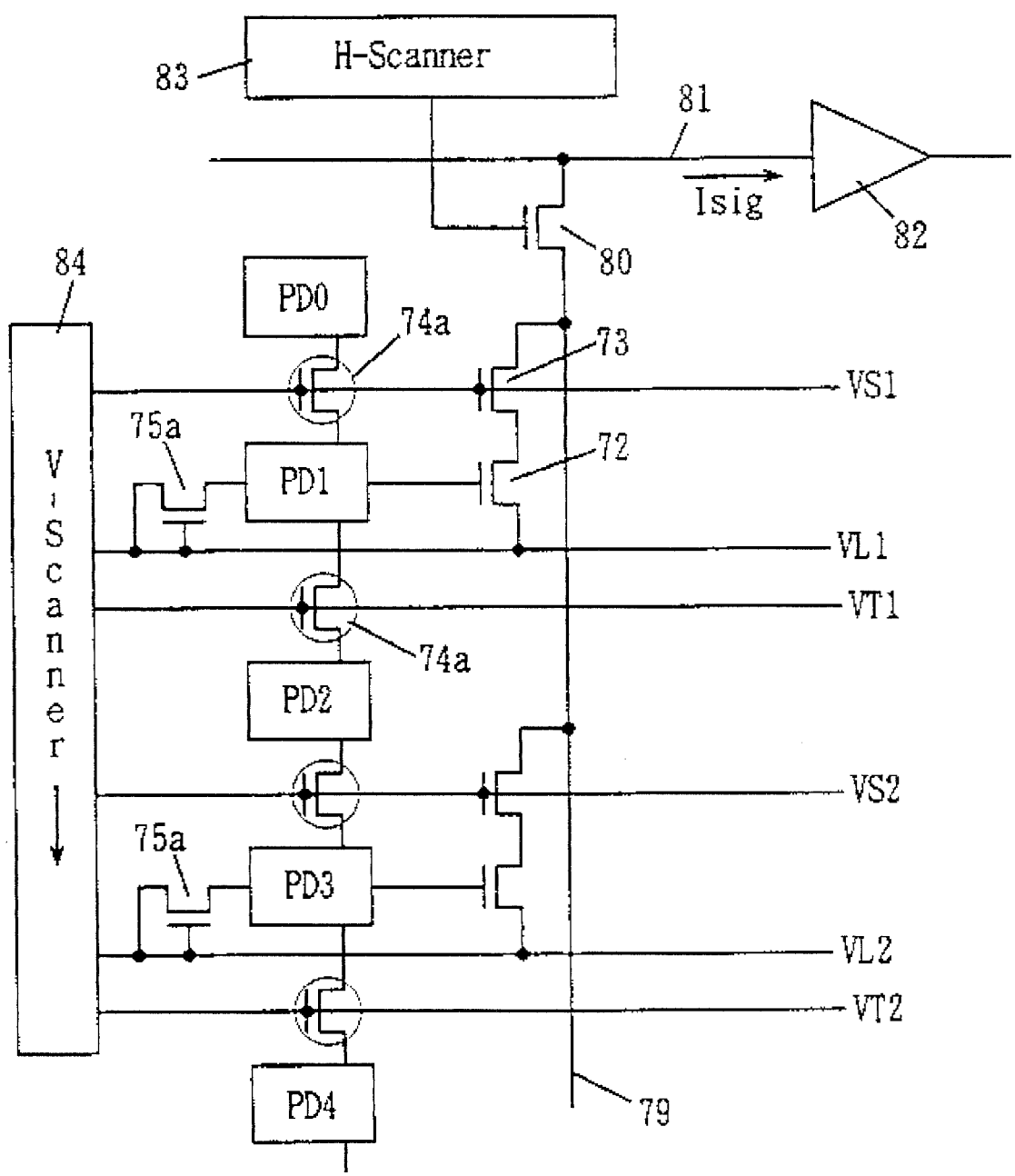
FIG. 14 is a partial circuit diagram schematically showing an image sensor according to yet a further embodiment of the present invention.

FIG. 14 schematically shows an image sensor according to yet a further embodiment of the present invention. The image sensor of FIG. 14 differs from the image sensor of FIG. 8 only by the substitution of double reset transistor 75 with a single reset transistor 75a. More specifically, the image sensor of FIG. 14 can have the number of reset transistors reduced to half of those used in FIG. 8. In the image sensor of FIG. 14, MOS transistor 74a for pixel combination and transistor 75a for reset have a high threshold voltage of Vth.

Figure 15:
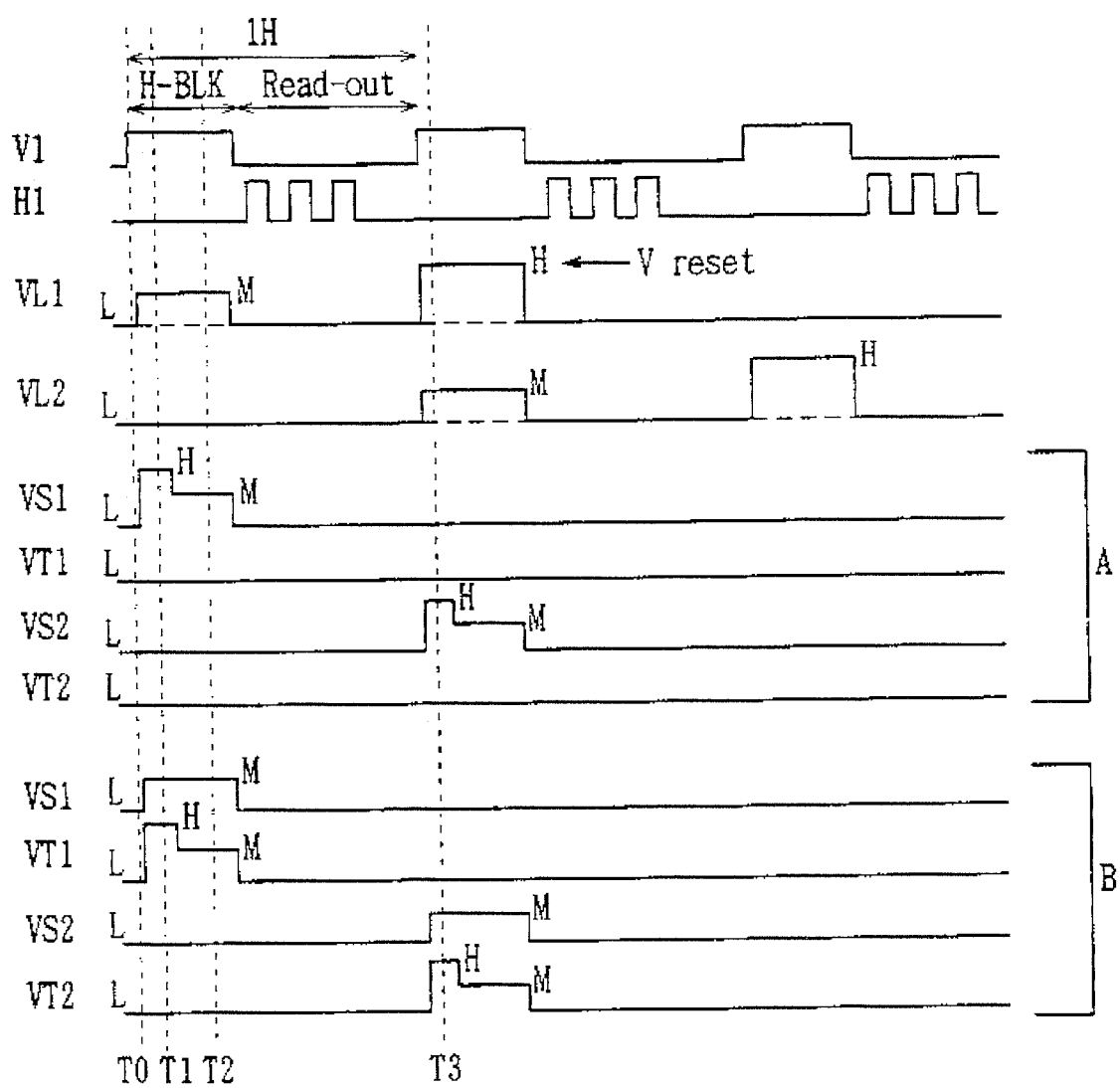
FIG. 15 is a timing chart for controlling the operation of the image sensor of FIG. 14.

FIG. 15 is a timing chart for describing the operation of the image sensor of FIG. 14. At time T1 following the starting time of T0 of one horizontal period 1H, pixel combination is carried out. At time T2, a signal is amplified to be read out on vertical signal line 79. Then, horizontal switch MOS transistor 80 is sequentially scanned, whereby the signal readout on vertical signal line 79 is read out to an external source. The reset of photoelectric conversion element PD is carried at time T3 during a horizontal blanking period right after the readout. The characters H and M in FIG. 15 represent a high level and an intermediate level, respectively, of a clock. By driving a clock having these levels, the potential of photoelectric conversion element PD can be set as shown in FIG. 13.

Figure 16:
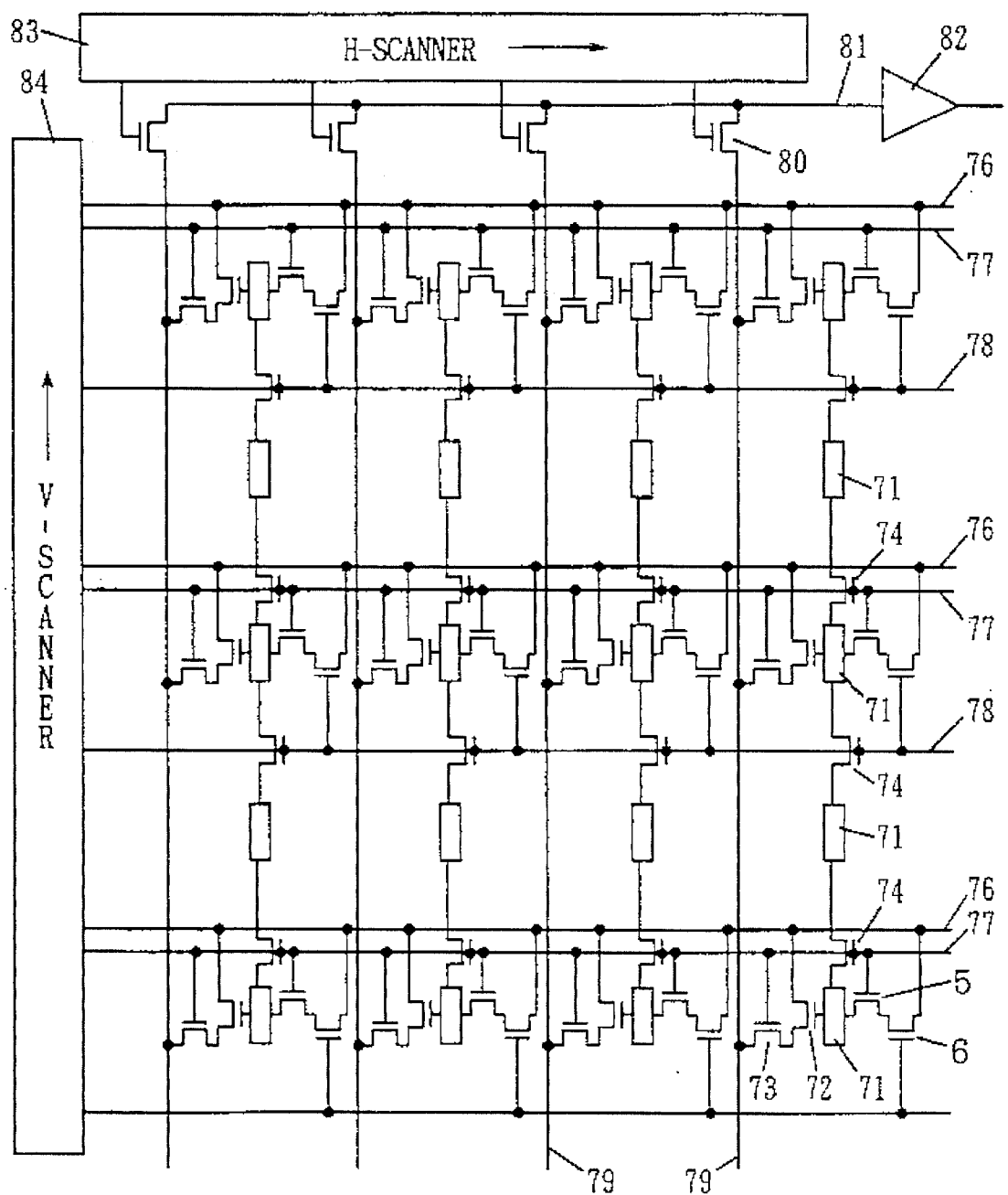
FIG. 16 is a circuit diagram schematically showing an image sensor according to yet another embodiment of the present invention.

FIG. 16 schematically shows an image sensor according to yet another embodiment of the present invention. In contrast to the image sensors of the above-described embodiments requiring a 3-value clock signal for operation, the image sensor of FIG. 16 can be operated with a 2-value clock signal. Referring to FIG. 16, the image sensor includes reset MOS transistors 5 and 6 connected in series with each other. The gate electrodes of MOS transistors 5 and 6 are connected to wirings different from each other. Photoelectric conversion element 71 is reset only when transistors 5 and 6 are both turned on at the same time.

Figure 17:
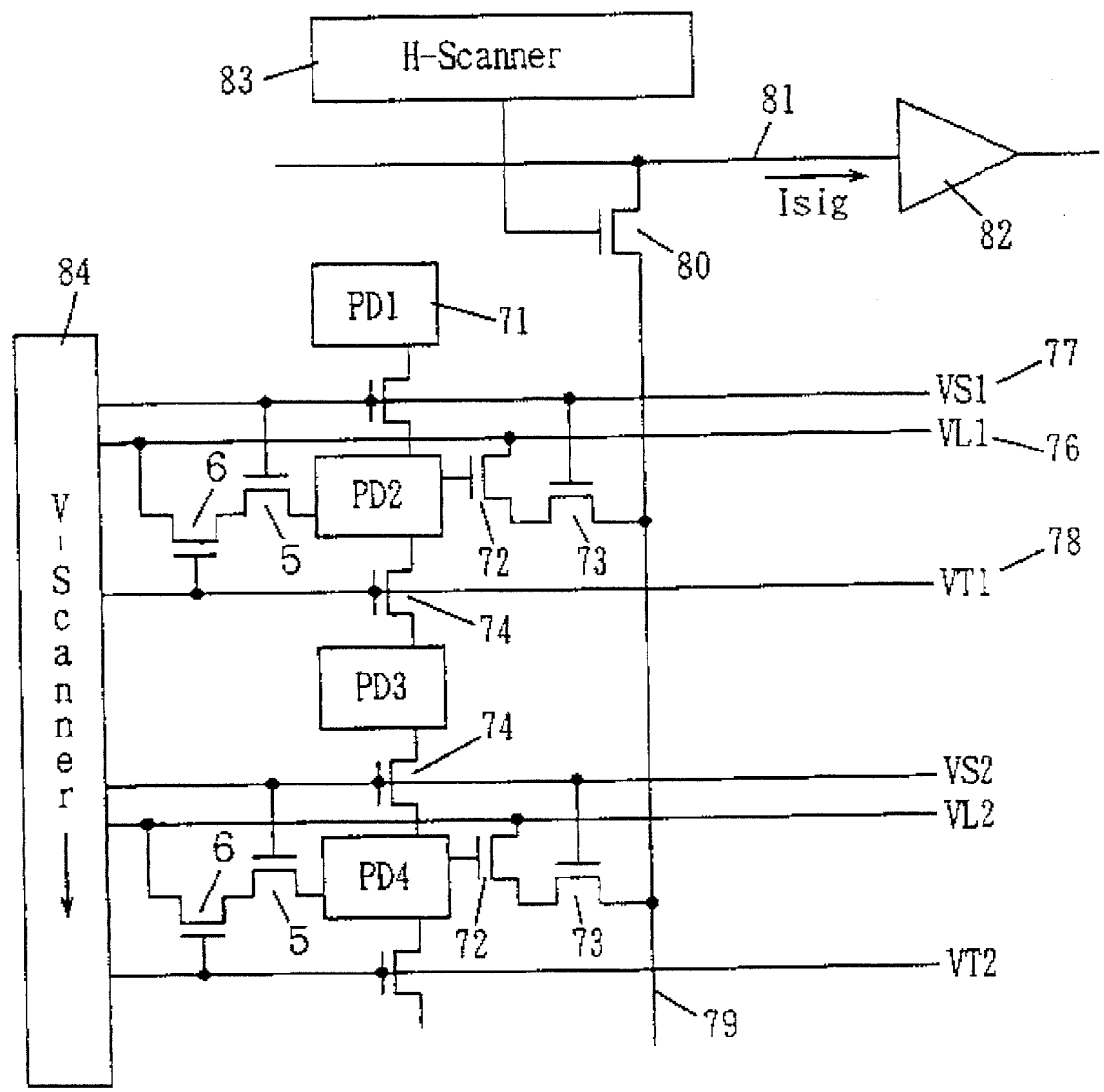
FIG. 17 is a partial sectional diagram for describing the operation of the image sensor of FIG. 16.
Figure 18:
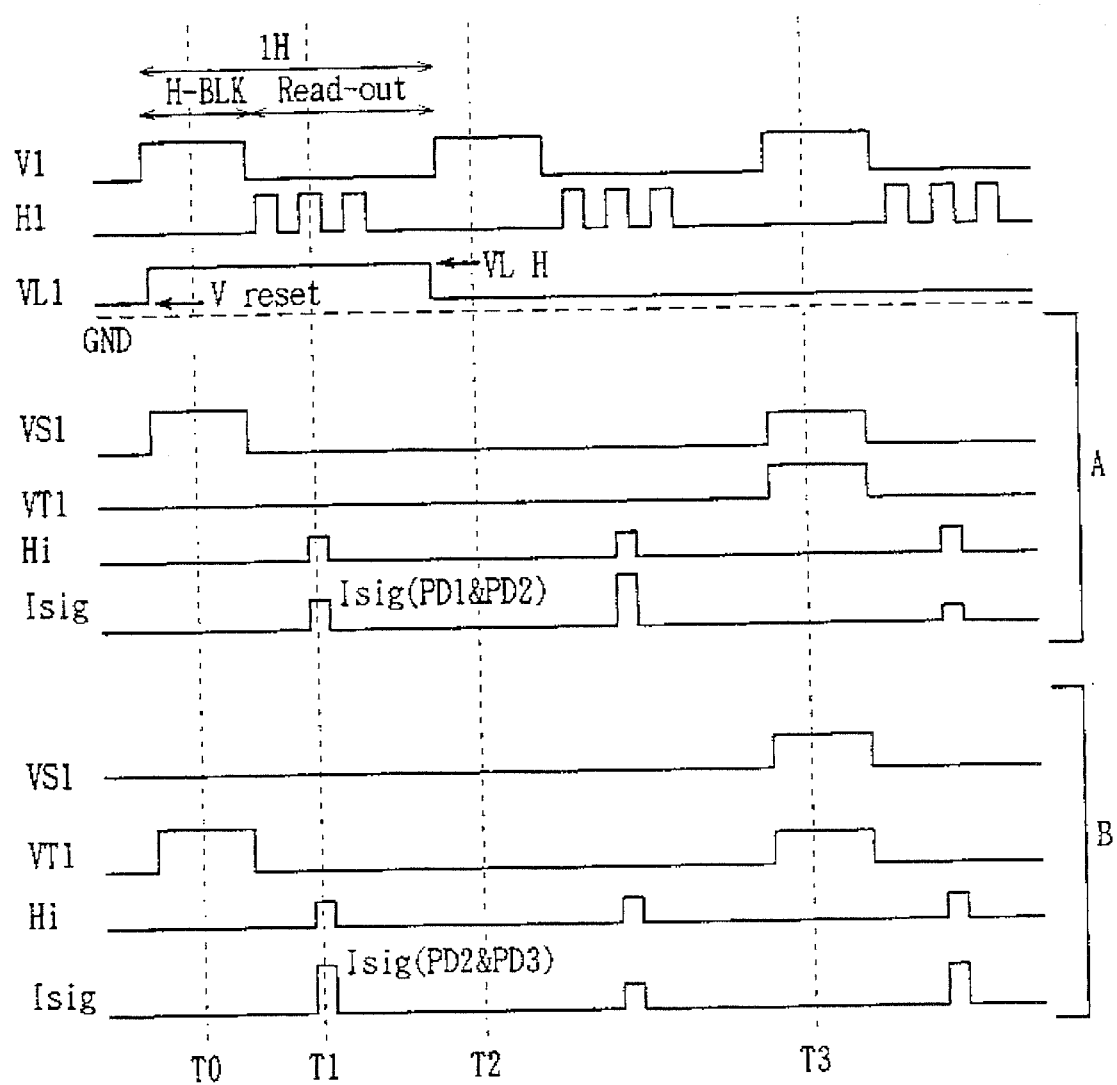
FIG. 18 is a timing chart for controlling the operation of the image sensor of FIG. 17.

FIG. 17 shows four continuous pixels in one column for describing the operation of the image sensor of FIG. 16. FIG. 18 is a timing chart for describing the operation of the pixels in FIG. 17. Referring to FIG. 18, at time T0, pixel combining is carried out, and at time T1, a signal is read out. Pixel reset is carried out at time T3 during a horizontal period after two horizontal periods from a readout. More specifically, adjacent vertical-selection line VS and pixel combine control line VT are set simultaneously at a high level at time T3, whereby three continuous photoelectric conversion elements (PD1–PD3) are reset simultaneously. Although a reset clock is inserted only during a horizontal blanking period H-BLK, a reset clock may be introduced over one horizontal period 1H as shown in the already-described embodiments. In such a case, the level of Vreset is set lower than the threshold voltage Vth of transistor 73.

Figure 19:
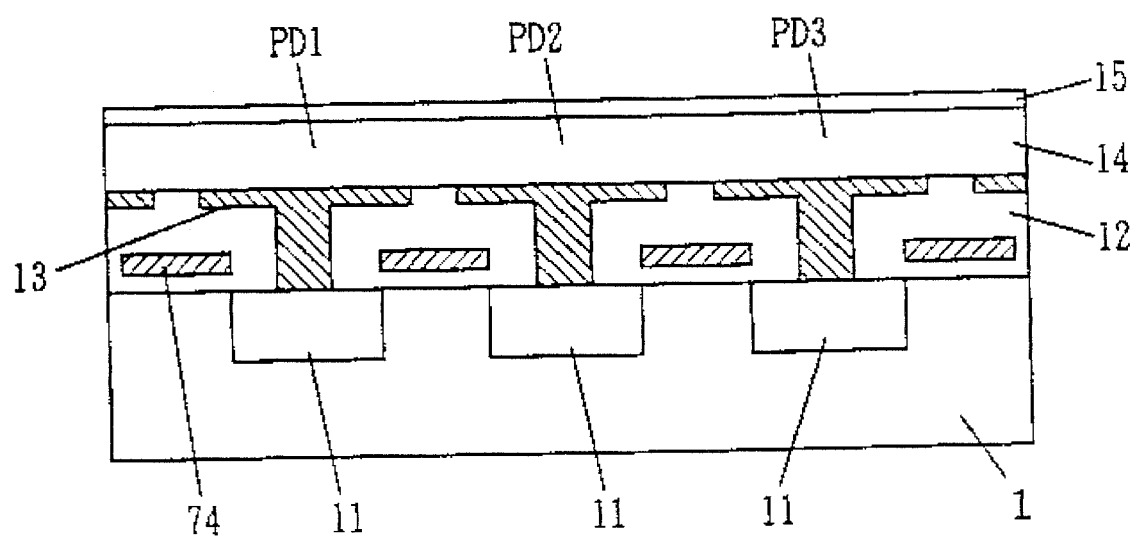
FIG. 19 is a schematic sectional view of an image sensor showing an example using an amorphous semiconductor layer for a photoelectric conversion element.

The present invention has been described of an image sensor having a photoelectric conversion element PD formed in a semiconductor substrate 1. The present invention is also applicable to a stacked type image sensor employing an amorphous semiconductor layer for photoelectric conversion element PD. Referring to FIG. 19, the image sensor includes a P type semiconductor substrate 1, an N type impurity layer 11 for storing charge, an interlayer insulating film 12, a pixel electrode 13, a photoelectric conversion film 14 of amorphous semiconductor such as amorphous Si, a transparent electrode 15 such as ITO, and a MOS transistor 74 for pixel combination.

MOS transistor 74 for controlling pixel combining is shown in FIG. 19 as a monolithic type transistor having a structure similar to that shown in FIG. 10 (A). Since other MOS transistors are required for forming a pixel, pixel-combining MOS transistor 74 is desirably formed as small as possible to comply with increase in integration density.

Figure 20:
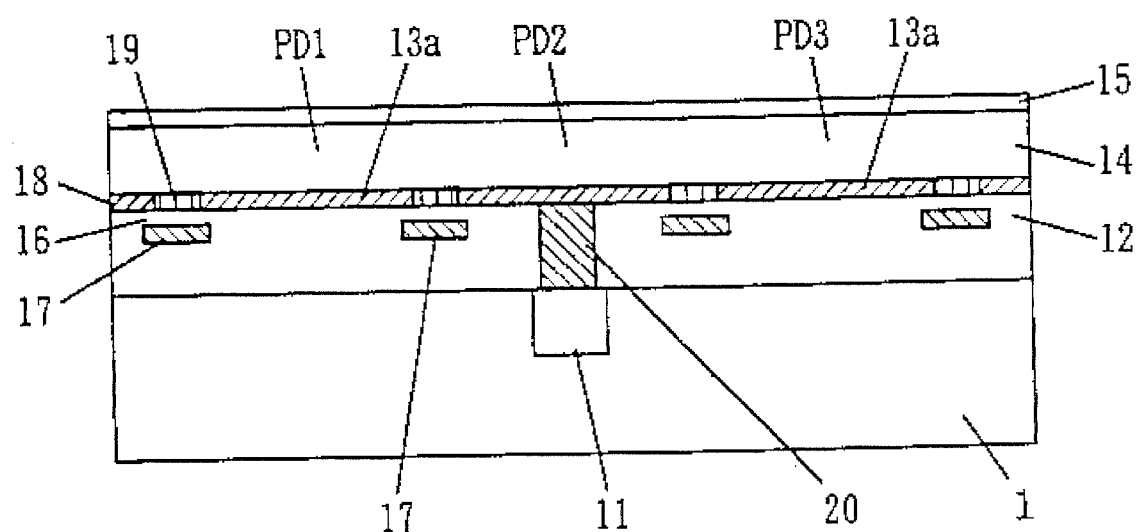
FIG. 20 is a schematic sectional view of an image sensor showing another example using an amorphous semiconductor layer for photoelectric conversion.

FIG. 20 shows another embodiment of an image sensor using an amorphous semiconductor layer for a photoelectric conversion element PD. The image sensor of FIG. 20 is similar to that of FIG. 19, except for a TFT (Thin Film transistor) used as the transistor for controlling pixel combination. More specifically, the image sensor of FIG. 20 includes a TFT gate oxide film 16, a gate electrode 17 of a TFT for pixel combination control, a layer 18 formed of, for example, a polysilicon film with a pixel underlying electrode 13a and a channel region 19 of TFT 17, and a conductor 20 for connecting pixel electrode 13a to a conductive region 11. By using the TFT as a transistor for pixel combination, a stacked layer structure with the gate of an amplification MOS transistor or the gate of a vertical-selection MOS transistor (not shown in FIG. 20) as the underlying layer of the gate of a TFT can be achieved to increase the integration density of an image sensor.

Improvement and a further preferable method of driving the image sensor of FIG. 14 will be described hereinafter.

Figure 21:
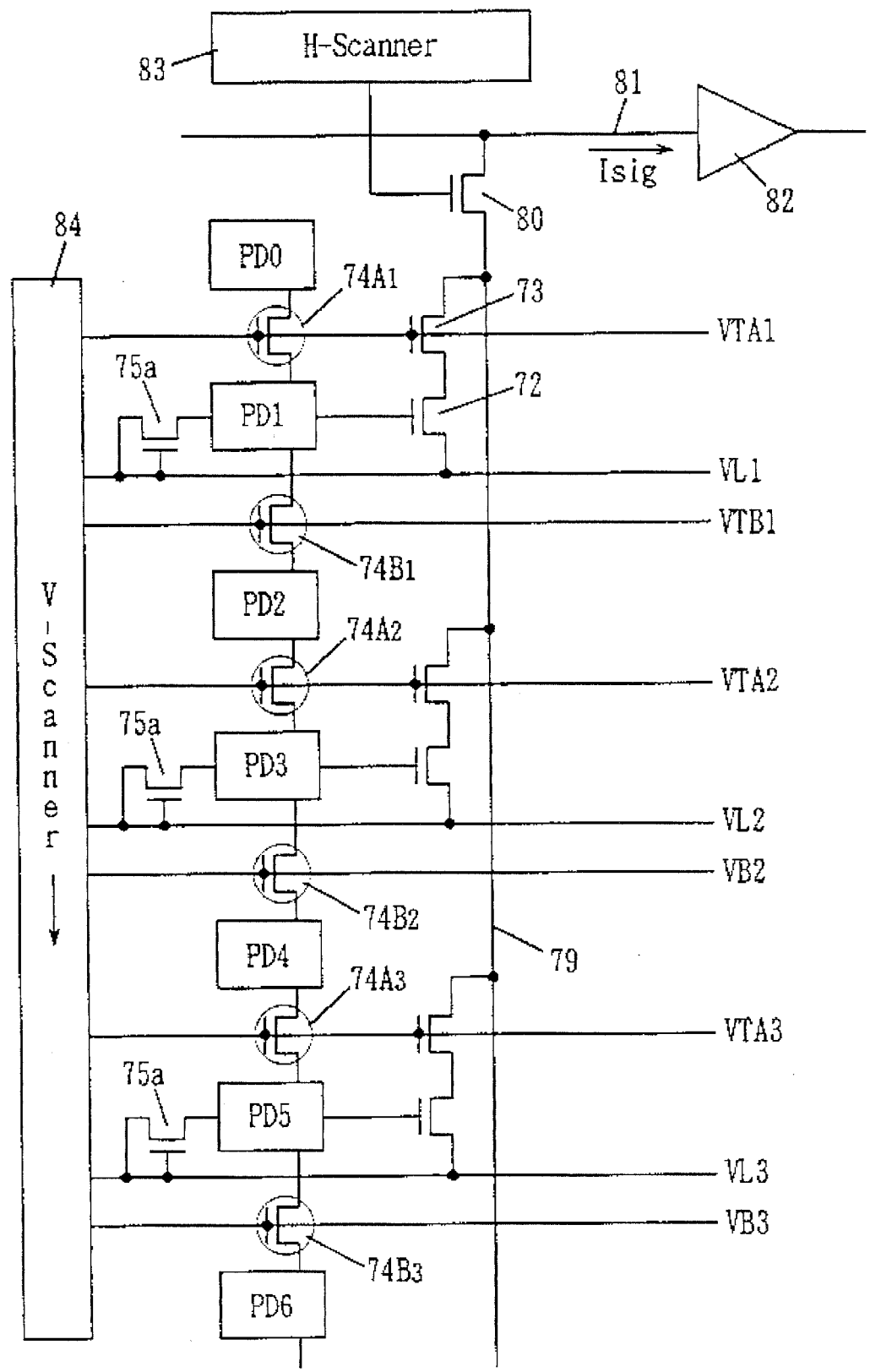
FIG. 21 is a partial circuit diagram with the reference characters partially changed from those of the image sensor of FIG. 14.

FIG. 21 shows an image sensor identical to that of FIG. 14, but has a few reference characters denoted differently for the sake of simplifying the following description. More specifically, MOS transistors 74A and 74B associated with combining the signal charge in fields A and B correspond to pixel-combining MOS transistor 74a of FIG. 14. Signal lines VTA and VTB correspond to signal lines VS and VT of FIG. 14. When the threshold voltages of pixel-combining MOS transistors 74A and 74B of FIG. 21 are not equal, or when capacitive coupling is in imbalance in the proximity of these MOS transistors, there is possibility of field flicker between fields A and B on the display screen if the image sensor of FIG. 21 is driven according to the timing chart shown in FIG. 15.

Figure 22:
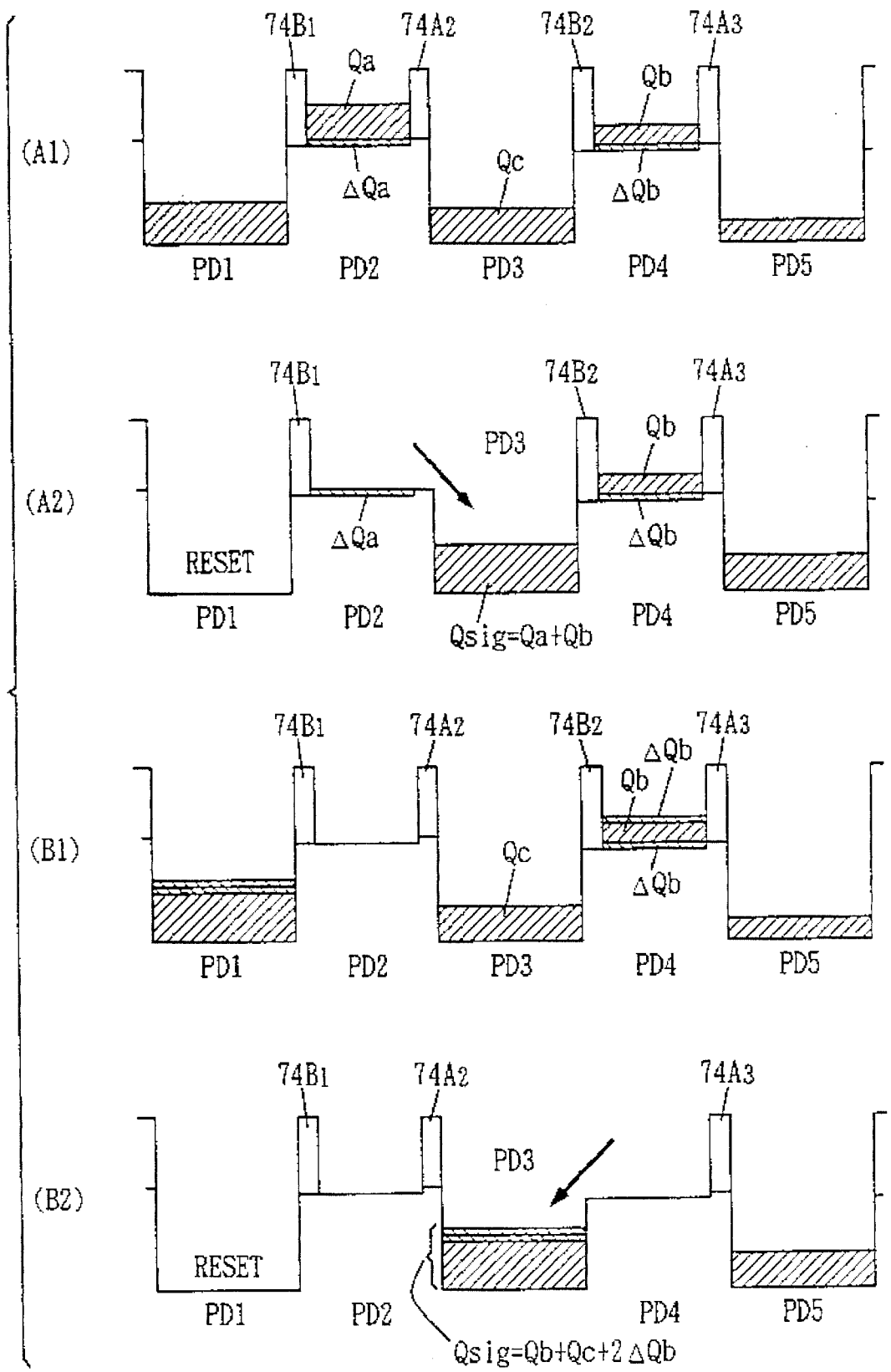
FIG. 22 is a potential diagram for describing an operation of driving the image sensor of FIG. 21 according to the timing chart of FIG. 15.

FIG. 22 schematically shows potential change in a cross section of a photoelectric conversion element PD along a column when the image sensor of FIG. 21 is driven according to the timing chart of FIG. 15. In FIG. 22, MOS transistor 74A of group A used for combining signal charge in reading out field A has a threshold voltage higher than that of MOS transistor 74B of a group B used for combining the signal charge in reading out field B. Referring to FIG. 22, (A1) and (A2) represent the operation of reading out signal charge from photoelectric conversion element PD3 in field A, and (B1) and (B2) represent a readout operation of field B. It is to be noted that the vertical scanning is directed from the left to the right.

In (A1), charges of (Qa+ΔQa), Qc, and (Qb+ΔQb) are stored in photoelectric conversion elements PD2, PD3, and PD4, respectively. When pixel-combining MOS transistor 74A$_2$ is selected to attain a conductive state, charge Qa stored in photoelectric conversion element PD2 is combined to photoelectric conversion element PD3 as shown by the arrow in (A2). Here, transistor 74A$_2$ rightwards of photoelectric conversion element PD2 has a threshold voltage higher than that of transistor 74B$_1$ located at the left side, so that residual charge ΔQa is left into photoelectric conversion element PD2. Signal charge Qsig combined in photoelectric conversion element PD3 includes charges Qa and Qb. Similarly, residual charge ΔQb is left in photoelectric conversion element PD4 after charge QB in photoelectric conversion element PD4 is combined into photoelectric conversion element PD5.

Then, in field B, charges Qc and (Qb+ΔQb) are stored in photoelectric conversion elements PD3 and PD4, respectively, according to a charge storing operation of 1 field period. However, there is residual charge ΔQb in photoelectric conversion element PD4 left from the preceding field A. Therefore, charge (Qb+2ΔQb) is accumulated in photoelectric conversion element PD4 as shown in (B1). It is to be noted that the charge of photoelectric conversion element PD2 is already combined in photoelectric conversion element PD1 in (B1).

When pixel combining MOS transistor 74B$_2$ is rendered conductive as shown in (B2), charge (Qb+2ΔQb) in photoelectric conversion element PD4 is combined into photoelectric conversion element PD3 as indicated by the arrow. More specifically, signal charge Qsig read out from photoelectric conversion element PD3 includes charge (Qb+Qc+2ΔQb).

Thus, in field A, the signal charge readout from photoelectric conversion element PD3 is Qsig=Qa+Qb, whereas in field B, the signal charge read out from photoelectric conversion element PD3 is Qsig=Qb+Qc+2ΔQb. Therefore, there is a charge difference of 2ΔQb according to the residual charge in the signal charge read out in fields A and B. This charge difference of 2ΔQb is the cause of field flicker.

It is appreciated from comparing (A2) from (B2) in FIG. 22 that photoelectric conversion element PD4 includes a stored charge of (Qb+ΔQb) in reading out signal charge of photoelectric conversion element PD3 in field A, whereas photoelectric conversion element PD4 has no accumulated charge in reading out the signal charge of photoelectric conversion element PD3 in field B. This means that the coupling capacity of lead lines associated with reading out signal charge, transistor junctions and gates differ between the fields. Such unequal coupling capacity may also become the cause of field flicker.

Figure 23:
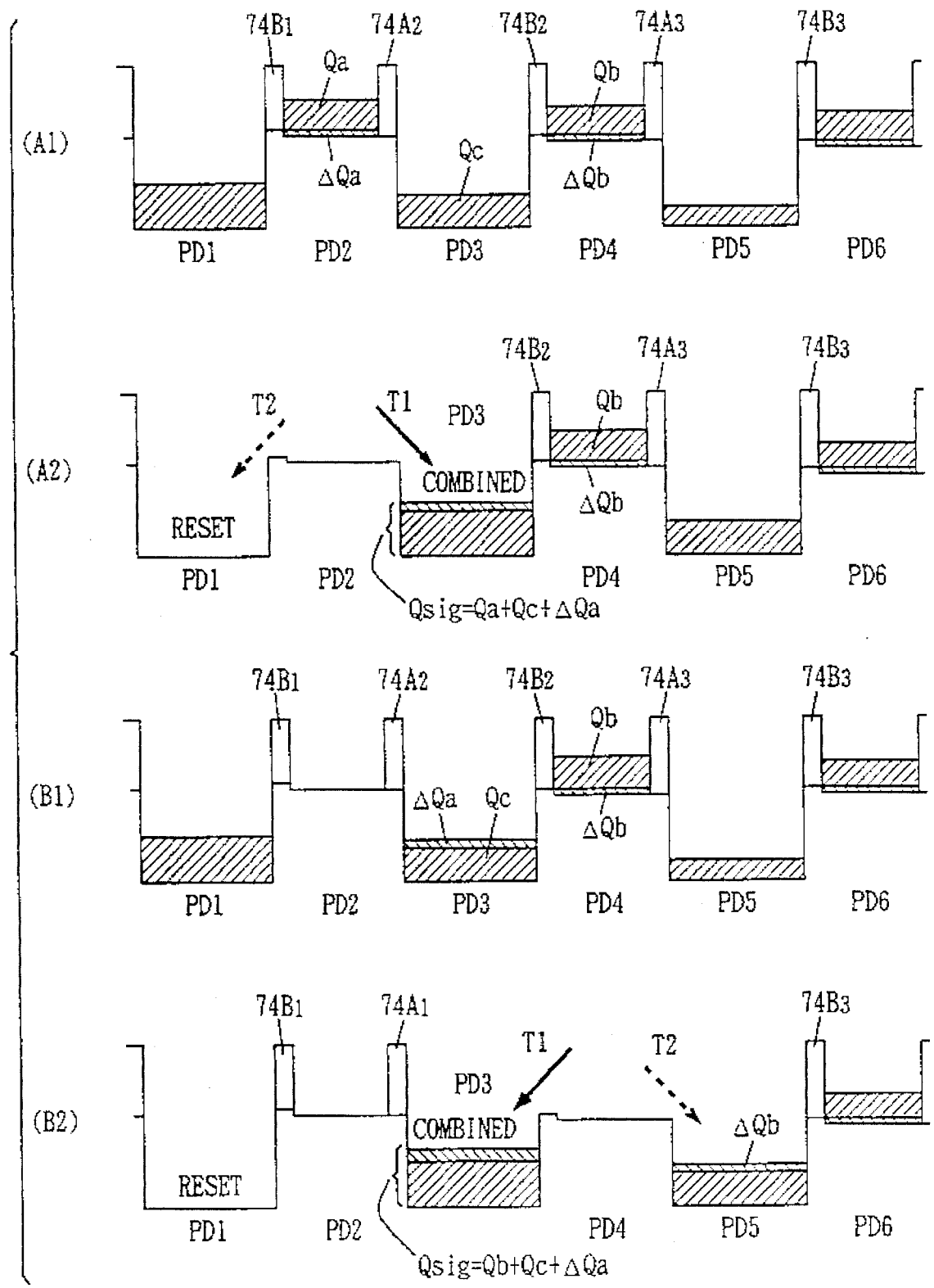
FIG. 23 is a potential diagram for describing a method of driving the image sensor of FIG. 21 according to another embodiment of the present invention.

FIG. 23 shows yet a still further embodiment of the present invention aiming at reducing the above-described field flicker. Although the potential change of FIG. 23 is similar to that of FIG. 22, FIG. 23 shows the potential change of the image sensor of FIG. 21 operated according to the timing chart of FIG. 24. In FIG. 23, transistor 74A of group A has a threshold voltage lower than that of transistor 74B of group B.

Figure 24:
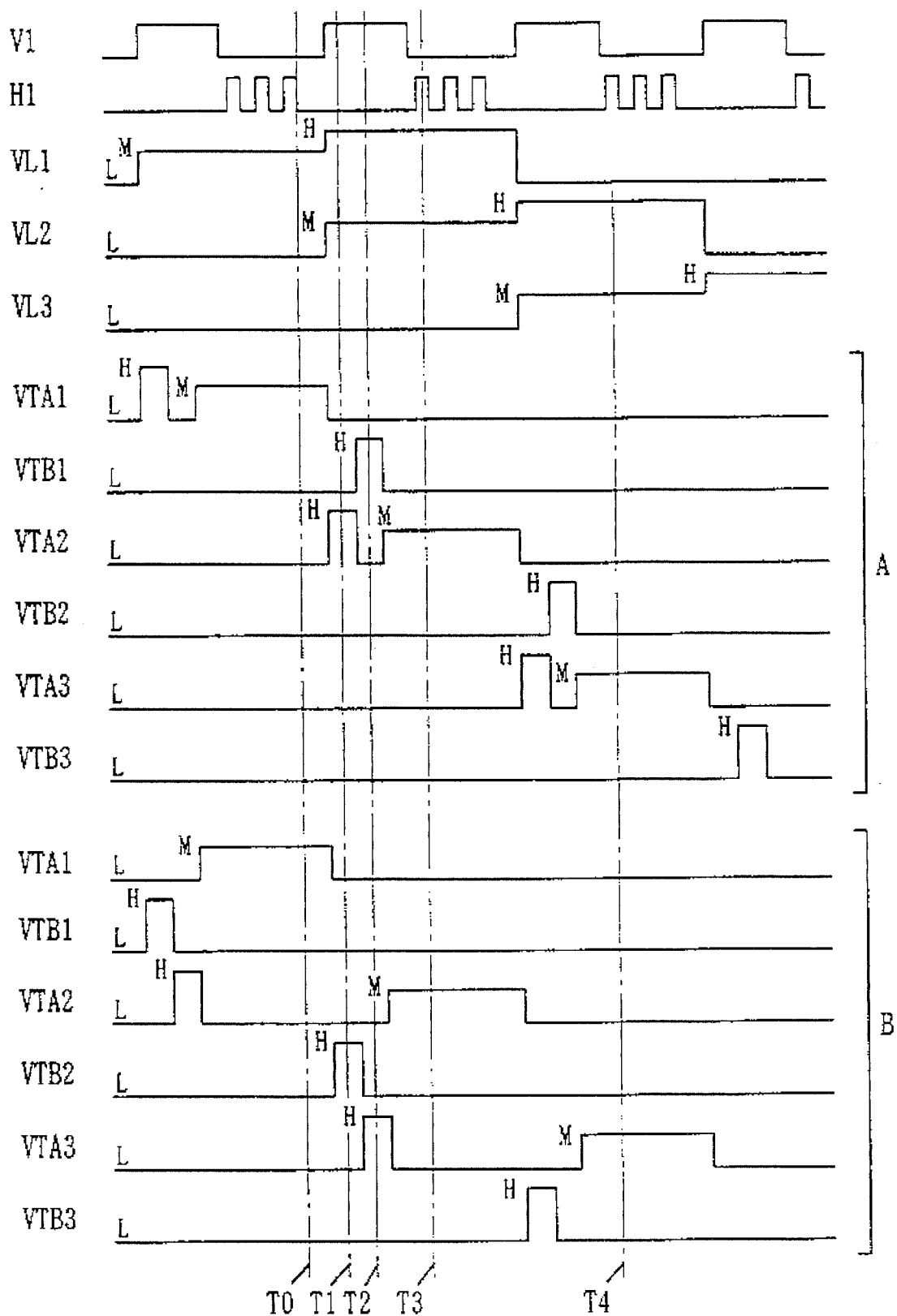
FIG. 24 is a timing chart for realizing the operation shown in FIG. 23.

Referring to FIG. 24, at time T0 of field A, charges of (Qa+ΔQa), Qc and (Qb+ΔQb) are stored in photoelectric conversion elements PD2, PD3 and PD4, respectively, as shown in FIG. 23 (A1). In other words, a charge storing operation of one field period precedes time T0.

At time T1, signal line VTA2 attains a H level (logical high), whereby signal-charge-combining MOS transistor 74A$_2$ conducts as shown in FIG. 23 (A2). The signal charge of photoelectric conversion element PD2 is combined into photoelectric conversion element 3 as shown by the solid line arrow of T1. Here, transistor 74A$_2$ rightwards of photoelectric conversion element PD2 has a threshold voltage lower than that of transistor 74B$_1$ located at the left side. Therefore, no residual charge is left in photoelectric conversion element PD2. Thus, the signal charge combined in photoelectric conversion element PD3 is Qsig=Qa+Qb+ ΔQa.

When signal line VTB1 attains a H level at time T2, transistor 74B₁ leftwards of photoelectric conversion element PD2 is rendered conductive as shown in FIG. 23 (A2), whereby the residual charge (in this case, no charge) is swept out as shown by the broken line arrow of T2.

At time T3 when signal lines VL2 and VTA2 are set at a M level, signal line H1 is brought to a H level to select horizontal MOS transistor 80. As a result, signal charge Qsig in photoelectric conversion element PD3 is read out.

At time T4 succeeding 1 horizontal period, signal line VL2 is brought to a H level, whereby photoelectric conversion element PD3 is reset to initiate charge storage. In other words, a reset operation is carried out for photoelectric conversion element PD1 during the time period of combining the signal charge of photoelectric conversion elements PD2 and PD3 and reading out the signal charge from photoelectric conversion element PD3. The stored charge of (Qb+ΔQb) of photoelectric conversion element PD4 is combined into photoelectric conversion element PD5 when transistor 74A₃ conducts, so that no residual charge is left in photoelectric conversion element PD4.

In field B succeeding a charge storing operation of 1 field period, charges (Qa+ΔQa), Qc and (Qb+ΔQb) are stored in photoelectric conversion elements PD2, PD3, and PD4, respectively, as in the prior field A. FIG. 23 (B1) represents the potential at time T0 in field B. Stored charge Qa of photoelectric conversion element PD2 is already combined into photoelectric conversion element PD1, and residual charge ΔQa is combined into photoelectric conversion element PD3. Because there is no residual charge from the preceding field A in photoelectric conversion element PD4, only charge (Qb+ΔQb) stored in 1 field period exists.

At time T1, signal line VTB2 attains a H level to render transistor 74B₂ conductive as shown in FIG. 23 (B2), whereby stored charge Qb in photoelectric conversion element PD4 is combined into photoelectric conversion element PD3 as shown by the solid line arrow of T1. Here, residual charge ΔQb is left in photoelectric conversion element PD4 since transistor 74B₂ leftwards of photoelectric conversion element PD4 has a threshold voltage higher than that of the right side transistor 74A₃. Therefore, signal charge combined in photoelectric conversion element PD3 is Qsig=Qb+Qc+ΔQa.

At time T₂, signal line VTA3 attains a H level to render transistor 74A₃ conductive, whereby residual charge ΔQb in photoelectric conversion element PD4 is swept out into photoelectric conversion element PD5, as shown by the broken line arrow of T2.

It can be appreciated from (A2) and (B2) of FIG. 23 that the signal charge read out from photoelectric conversion element PD3 is Qsig=Qa+Qc+ΔQa in field A, and Qsig= Qb+Qc+ΔQ a in field B. This means that a field flicker caused by residual charge will not be generated since both signal charge read out from fields A and B include equal residual charge ΔQa.

FIG. 25 is similar to FIG. 23, and shows the case where MOS transistor 74A of group A has a threshold voltage higher than that of MOS transistor 74B of group B. At time T0 of FIG. 24, photoelectric conversion elements PD2, PD3, and PD4 are stored with charges of (Qa+ΔQa), Qc and (Qb+ΔQb), respectively, in field A, as shown in FIG. 25 (A1).

At time T1, charge Qa of photoelectric conversion element PD2 is combined into photoelectric conversion element PD3, as shown in FIG. 25 (A2). Here, residual charge ΔQa is left in photoelectric conversion element PD2 because transistor 74A₂ rightwards of PD2 has a threshold voltage higher than that of transistor 74B₁ located at the left side. More specifically, the signal charge combined in photoelectric conversion element PD3 is Qsig=Qa+Qc.

At time T2, residual charge ΔQa in PD2 is swept out into photoelectric conversion element PD1. Here, residual charge ΔQa is discarded since photoelectric conversion element PD1 is reset. Similarly, residual charge ΔQb in photoelectric conversion element PD4 is swept out to be discarded when photoelectric conversion element PD3 is reset. In other words, there is no residual charge in photoelectric conversion element PD4 when scanning of field A ends.

FIG. 25 (B1) shows the potential at time T0 in field B. Stored charge (Qa+ΔQa) in photoelectric conversion element PD2 is already combined into photoelectric conversion element PD1, and there is no residual charge in PD2. In photoelectric conversion element PD4, there is residual charge ΔQb left of the preceding field A, so that charge (Qb+ΔQb) is stored in 1 field period.

At time T1, stored charge (Qb+ΔQb) in photoelectric conversion element PD4 is combined into photoelectric conversion element PD3 as shown in FIG. 25 (B2). There is no residual charge left in photoelectric conversion element PD4 since transistor 74B₂ leftwards of photoelectric conversion element PD4 has a threshold voltage lower than that of the right side transistor 74A₃. More specifically, the signal charge combined in photoelectric conversion element PD3 is Qsig=Qb+Qc+ΔQb.

It can be appreciated from (A2) and (B2) of FIG. 25 that the signal charge read out from photoelectric conversion element PD3 is Qsig=Qa+Qc and Qsig=Qb+Qc+ΔQb, in fields A and B, respectively. In other words, the signal charge read out in field B additionally includes residual charge ΔQb in comparison with that read out in field A. Residual charge ΔQb in the signal charge of FIG. 25 (B2) is half the residual charge 2ΔQb in the signal charge of FIG. 22 (B2). Therefore, field flicker caused by residual charge in the signal charge is reduced to a half.

It is appreciated from comparing FIG. 23 to FIG. 25 that pixel combining MOS transistor 74A of group A preferably has a threshold voltage lower than that of transistor 74B of group B. The channel length of transistor 74A of group A is set smaller than that of transistor 74B of group B for transistor 74A to have a threshold voltage lower than that of transistor 74B. It is appreciated that such control of a channel length can be carried out easily without increasing a manufacturing step thereof. Alternatively, the channel width of transistor 74A of group A may be made larger than that of transistor 74B of group B for transistor 74A to have a threshold voltage lower than that of transistor 74B. The channel width of a MOS transistor can be controlled easily without increasing a manufacturing step.

An effect similar to that of setting the threshold voltage of transistor 74A of group A lower than that of transistor 74B of group B can be achieved by selecting a voltage of control signal VTA of transistor 74A higher than that of control signal VTB of transistor 74B.

Figure 26:
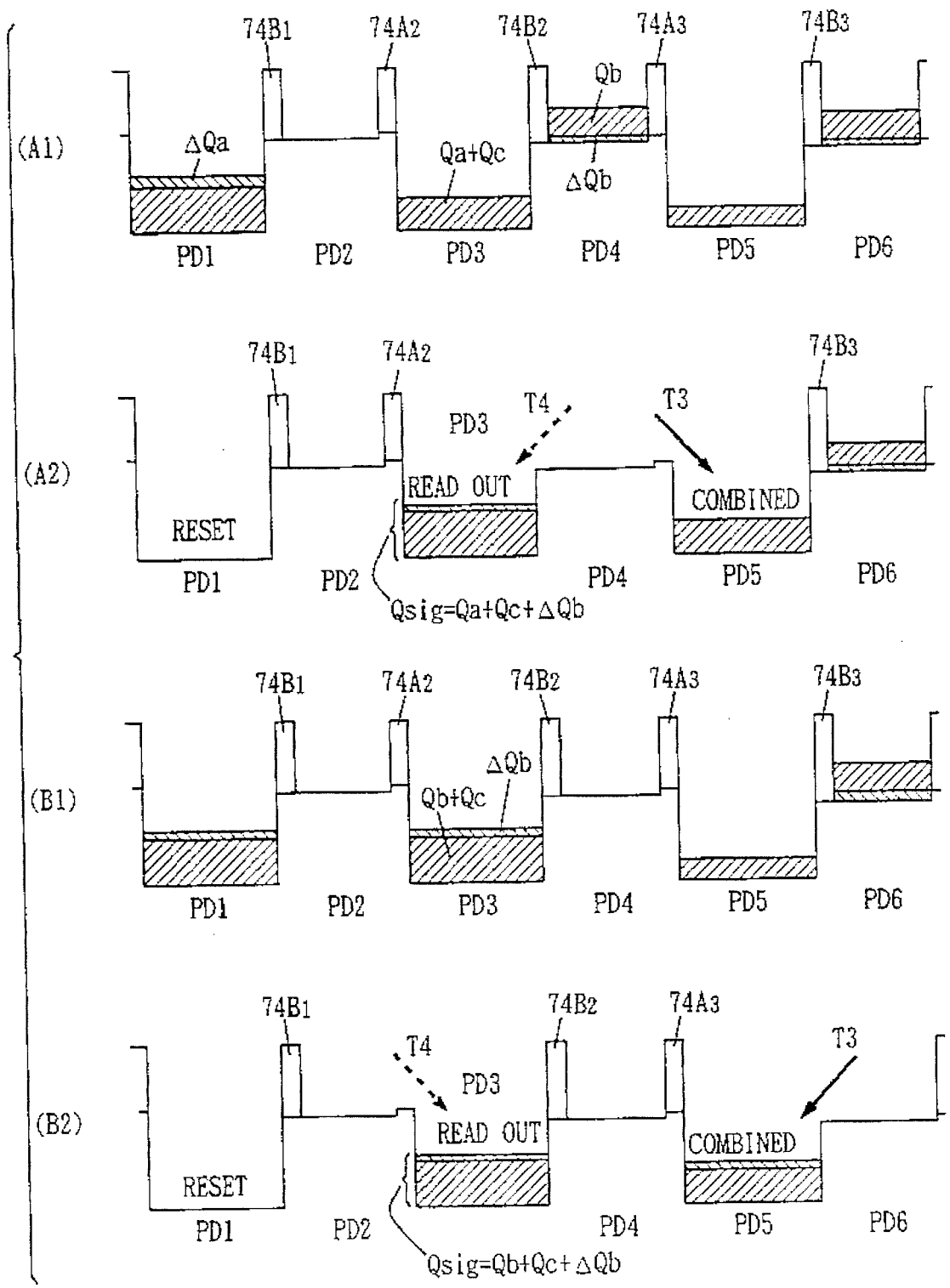
FIG. 26 is a potential diagram for describing a method of driving the image sensor of FIG. 21 according to another embodiment of the present invention.
Figure 27:
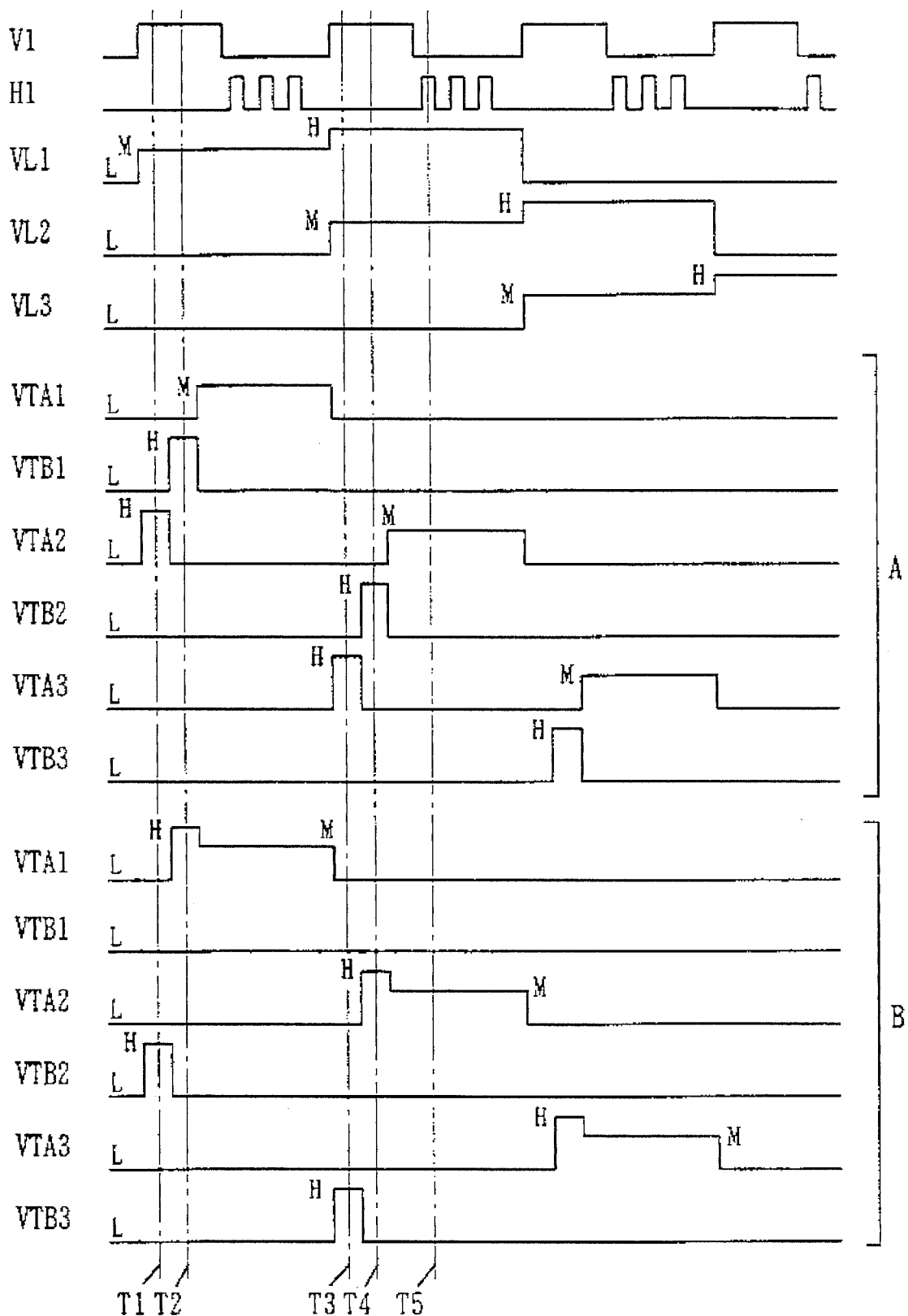
FIG. 27 is a timing chart for realizing the operation of FIG. 26.

A method of driving an image sensor according to another embodiment of the present invention will be described hereinafter with reference to FIGS. 26 and 27. FIG. 26 shows a potential diagram similar to that of FIG. 25, representing operation according to the timing chart of FIG. 27.

At time T1 in field A, signal line VTA2 is brought to a H level to render transistor 74A₂ conductive, whereby stored charge Qa in photoelectric conversion element PD2 is combined into photoelectric conversion element PD3. Here, charge Qa and Qc are combined in photoelectric conversion element PD3, and residual charge ΔQa is left in photoelectric conversion element PD2. At time T2, signal line VTB1 is brought to a H level to render transistor $74B_1$ conductive, whereby residual charge ΔQa in photoelectric conversion element PD2 is swept out into photoelectric conversion element PD1. FIG. 26 (A1) shows the state at time T2.

Similarly, at time T3 of the next horizontal period, signal line VTA3 is brought to a H level to render transistor $74A_3$ conductive, whereby stored charge Qb in photoelectric conversion element PD4 is combined into photoelectric conversion element PD5, as shown by the solid line arrow of T3. At time T4, signal line VTB2 is brought to a H level to render transistor $74B_2$ conductive, whereby residual charge ΔQb in photoelectric conversion element PD4 is swept out into photoelectric conversion element PD3, as shown by the broken line arrow of T4. More specifically, the signal charge combined in photoelectric conversion element PD3 is Qsig= Qa+Qc+ΔQb.

At time T5, signal line H1 is brought to a H level while signal lines VL2 and VTA2 attain an intermediate level, whereby signal charge Qsig is read out via horizontal MOS transistor 80. Here, signal VL1 attains a H level, whereby photoelectric conversion element PD1 is reset.

At time T1 in field B, signal line VTB2 is brought to a H level to render transistor $74B_2$ conductive, whereby stored charge (Qb+ΔQb) in photoelectric conversion element PD4 is combined into photoelectric conversion element PD3. Here, the charge combined in PD3 is (Qb+Qc+ΔQb). This status is shown in FIG. 26 (B1).

Similarly, at time T3 of the next horizontal period, signal line VTB3 is brought to a H level to render transistor $74B_3$ conductive, whereby stored charge in photoelectric conversion element PD6 is combined into photoelectric conversion element PD5. At time T4, signal line VTA2 is brought to a H level to render transistor $74A_2$ conductive, whereby residual charge (in this case, there is no residual charge) in photoelectric conversion element PD2 is swept out into photoelectric conversion element PD3.

Then, at time T5, signal line H1 is brought to a H level, whereby signal charge Qsig=Qa+Qc+ΔQb in photoelectric conversion element PD3 is read out via horizontal MOS transistor 80. Here, signal line VL1 attains a H level, and photoelectric conversion element PD1 is reset.

It is appreciated from (A2) and (B2) of FIG. 26 that field flicker caused by residual charge will not be generated since there is no difference in the residual charge in signal charge Qsig in fields A and B. It is also appreciated that there is no residual charge in photoelectric conversion elements PD2 and PD4 located at both sides of photoelectric conversion element PD3 from which signal charge is read out. Therefore, field flicker according to unequal coupling capacity is reduced.

Figure 28:
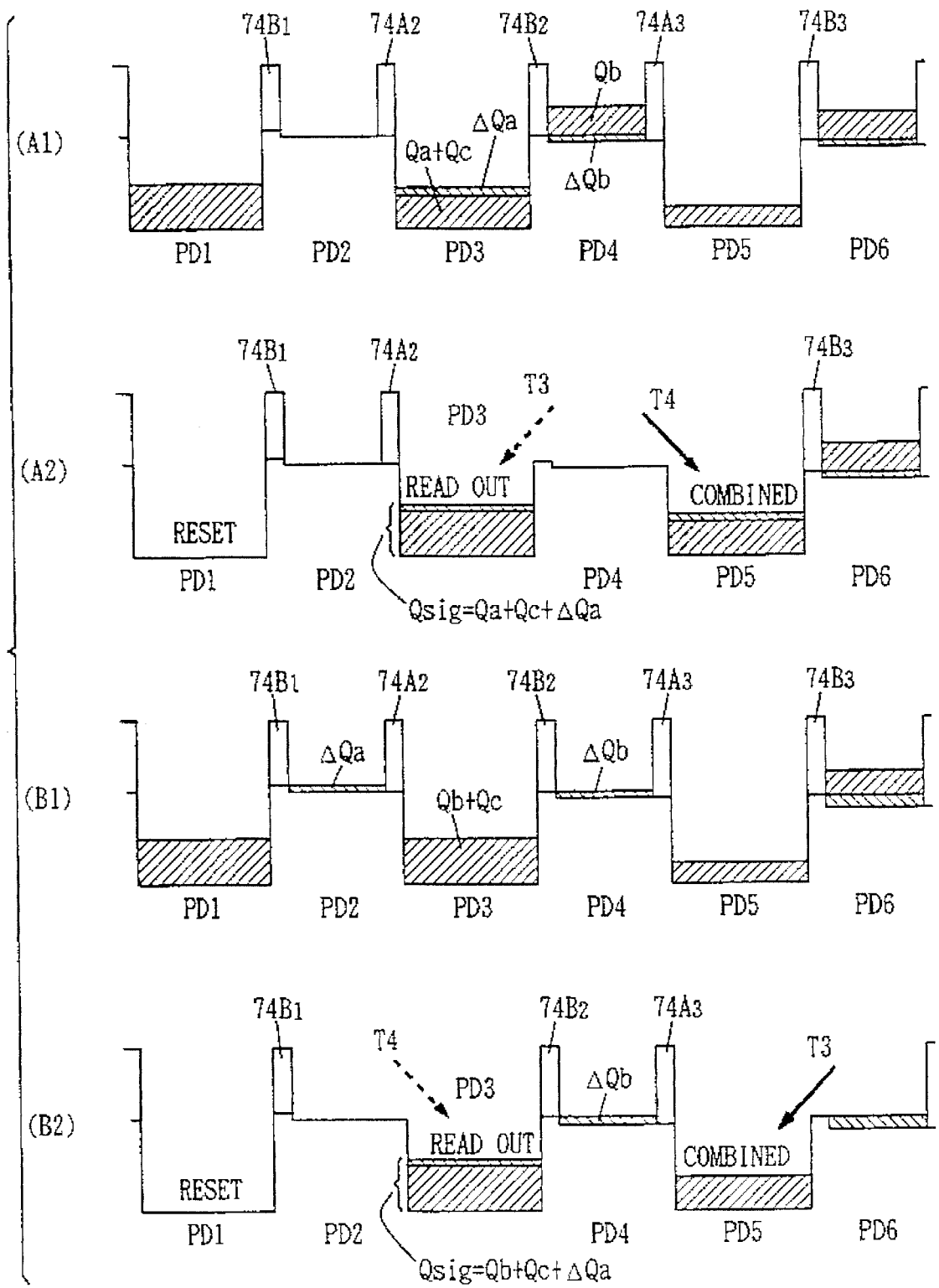
FIG. 28 is a potential diagram illustrating an operation realized by the timing chart of FIG. 27 similar to FIG. 26.

Although an embodiment was described in which MOS transistor 74A of group A has a threshold voltage higher than that of MOS transistor 74B of group B in FIG. 26, it is to be understood that a similar effect can be achieved in opposite cases from FIG. 28.

Figure 29:
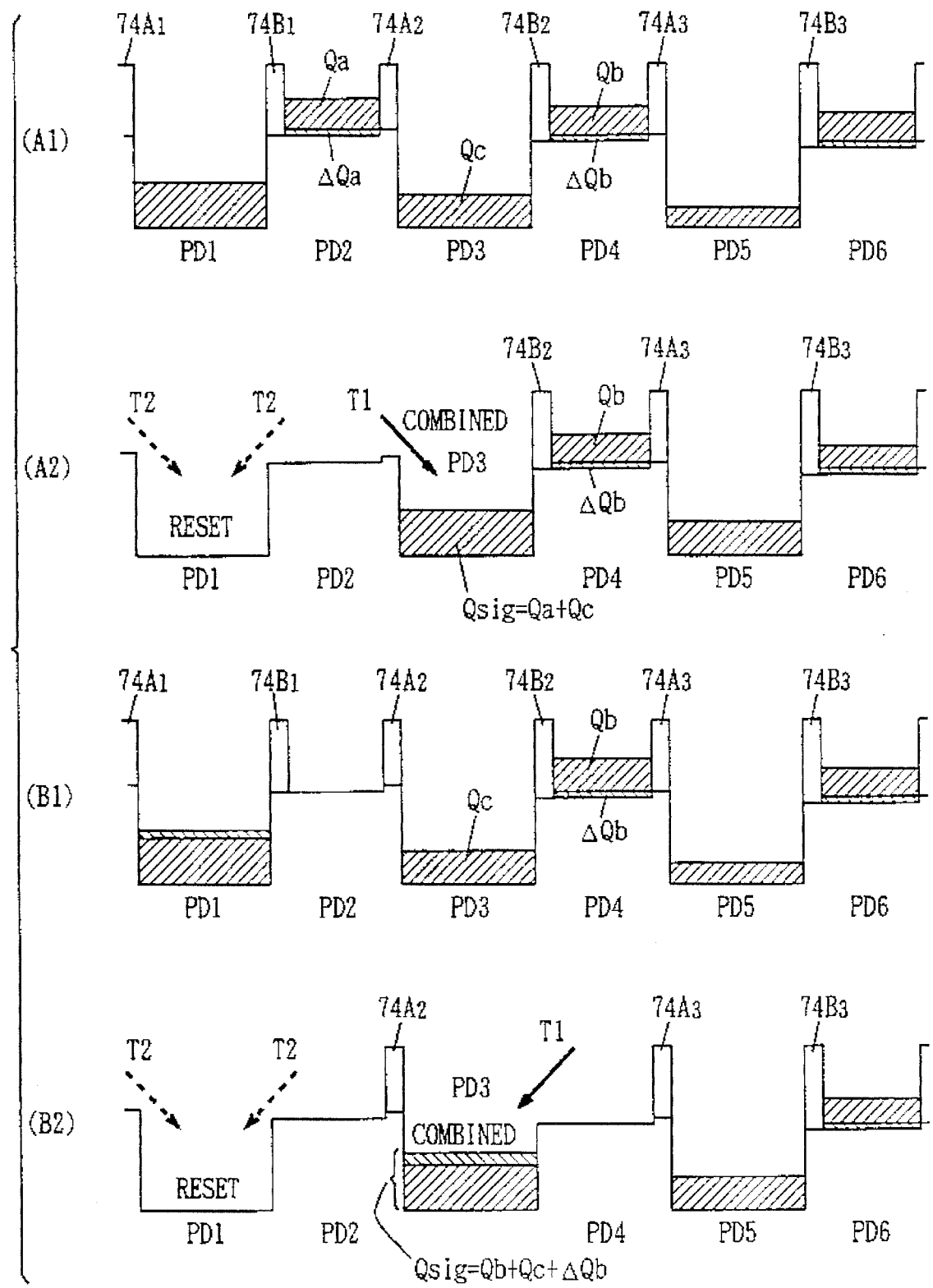
FIG. 29 is a potential diagram for describing a method of driving the image sensor of FIG. 21 according to another embodiment of the present invention.
Figure 30:
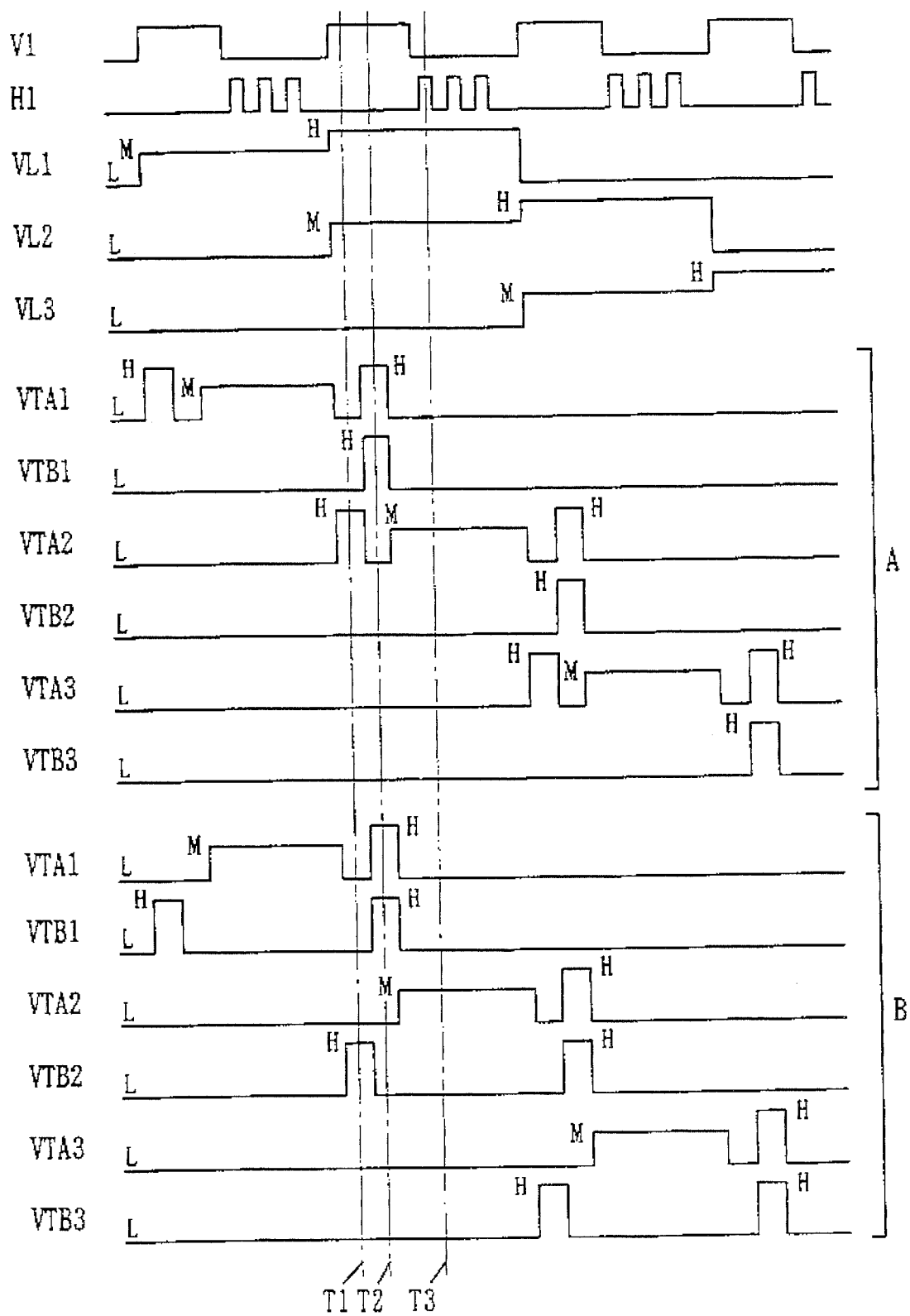
FIG. 30 is a timing chart for realizing the operation of FIG. 29.

A method of driving an image sensor according to another embodiment of the present invention will be described with reference to FIGS. 29 and 30. FIG. 29 shows a potential diagram similar to that of FIG. 25, and represents the operation according to the timing chart of FIG. 30.

Referring to FIG. 29 (A1), photoelectric conversion elements PD2, PD3 and PD4 are indicated storing charge in field A. Referring to FIG. 29 (A2), signal line VTA2 is brought to a high level at time T1 to render transistor $74A_2$ conductive, whereby stored charge Qa in photoelectric conversion element PD2 is combined into photoelectric conversion element PD3. Here, residual charge ΔQa is left in photoelectric conversion element PD2 since transistor $74A_2$ rightwards of photoelectric conversion element PD2 has a threshold voltage higher than that of transistor $74B_1$ located at the left side.

At time T2, signal lines VT1 and VTB1 are brought to a H level to render conductive transistors $74A_1$ and $74B_1$ located at both sides of a photoelectric conversion element PD1, whereby residual charge ΔQa in photoelectric conversion element PD2 is swept out into photoelectric conversion element PD1. At time T3 when signal lines VL2 and VTA2 attain an intermediate level, signal line H1 is brought to a H level, whereby signal charge Qsig=Qa+Qc is read out from photoelectric conversion element PD3 via horizontal MOS transistor 80. Here, signal line VL1 attains a H level, and photoelectric conversion element PD1 is reset.

In field B shown in FIG. 29 (B1), stored charge in photoelectric conversion element PD2 is already combined into photoelectric conversion element PD1. At time T1, signal line VTB2 is brought to a H level to render transistor $74B_2$ conductive, whereby stored charge (Qb+ΔQb) in photoelectric conversion element PD4 is combined in photoelectric conversion element PD3. There is no residual charge in photoelectric conversion element PD4 as shown in FIG. 29(B2), and the signal charge combined in photoelectric conversion element PD3 becomes Qsig=Qb+Qc+ΔQb. Similar to field A, at time T2, signal lines VTA1 and VTB1 are brought to a H level, whereby residual charge (in this case, no residual charge) is swept out into photoelectric conversion element PD1. At time T3, signal line H1 is brought to a H level, whereby signal charge Qsig is read out from photoelectric conversion element PD3 via horizontal MOS transistor 80.

It is appreciated from (A2) and (B2) of FIG. 29 that the signal charge read out in field B includes an extra residual charge of ΔQb in comparison with that read out in field A. In the driving method of FIG. 22, the signal charge in field B includes residual charge 2ΔQb. It is appreciated that the driving method according to the embodiment of FIG. 29 has the field flicker caused by residual charge reduced to a half in comparison with the driving method of FIG. 22.

Figure 31:
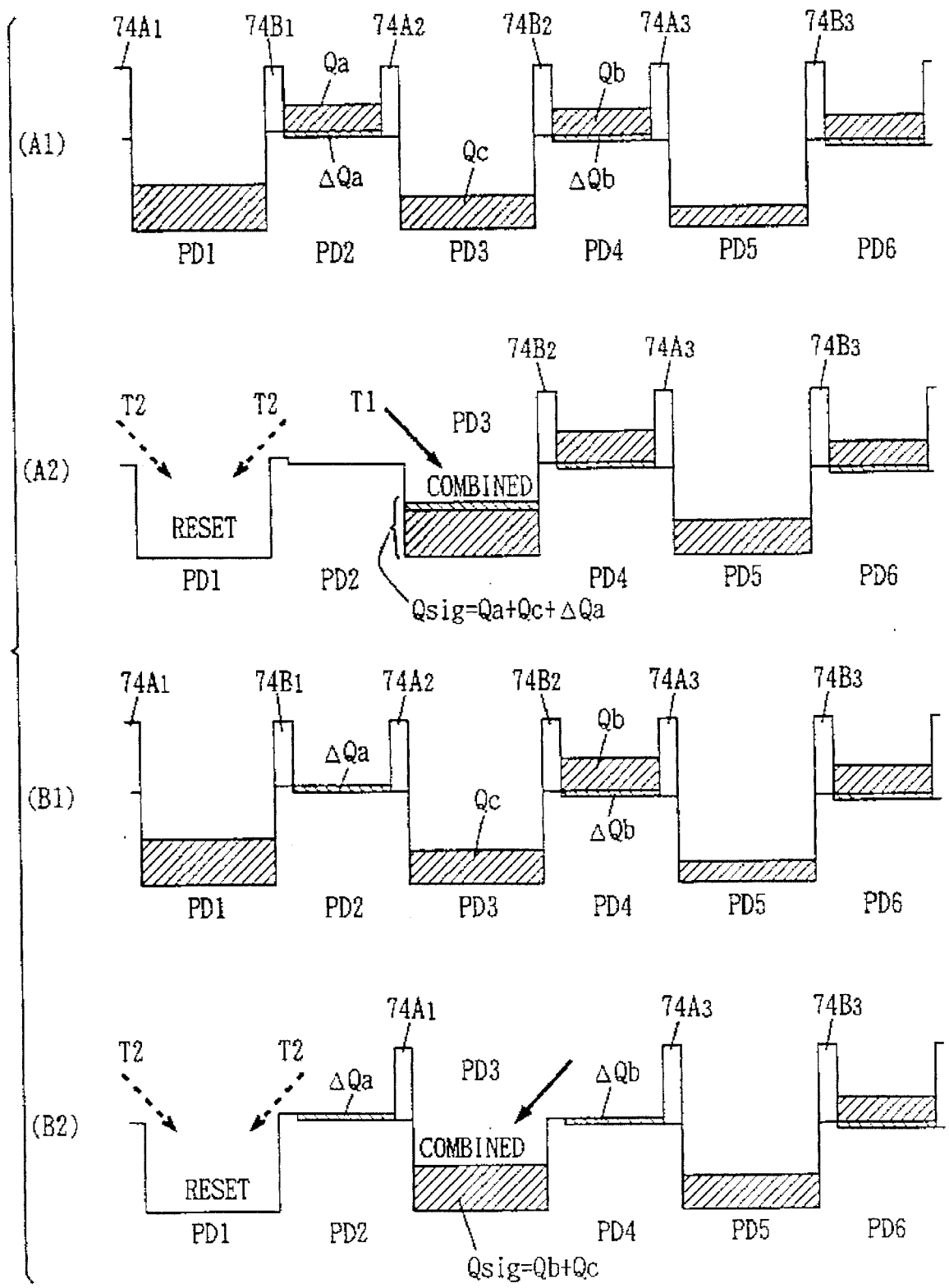
FIG. 31 is a potential diagram illustrating the operation realized by the timing chart of FIG. 30 similar to FIG. 29.

Although the embodiment of FIG. 29 was described in which MOS transistor 74A of group A has a threshold voltage higher than that of MOS transistor 74B of group B, it is to be appreciated that a similar effect can be obtained in opposite cases as from FIG. 31.

In the embodiments shown in FIGS. 23–31, the plurality of power supply lines VLs in the proximity of signal lines VTA and VTB attaining a H level are set to a H level, a M Level, and a L level, respectively (for example, refer to times T1 and T2 in FIG. 24) when signal lines VTA and VTB attain a H level in combining signal charge and in sweeping out residual charge. When a plurality of power supply lines VLs located in close proximity have potential differing from each other, the potentials of signal lines VTA and VTB attaining a H level are influenced by a capacitive coupling with power supply line VL. A change in potential in signal lines VTA or VTB attaining a H level will influence the conductive state of pixel combining transistors 74A or 74B, leading to increase in flicker between fields.

It is therefore desirable to establish equal potential (preferably to a L level) with each other of the plurality of power supply lines VLs near signal line VTA or VTB attaining a H level.

Figure 32:
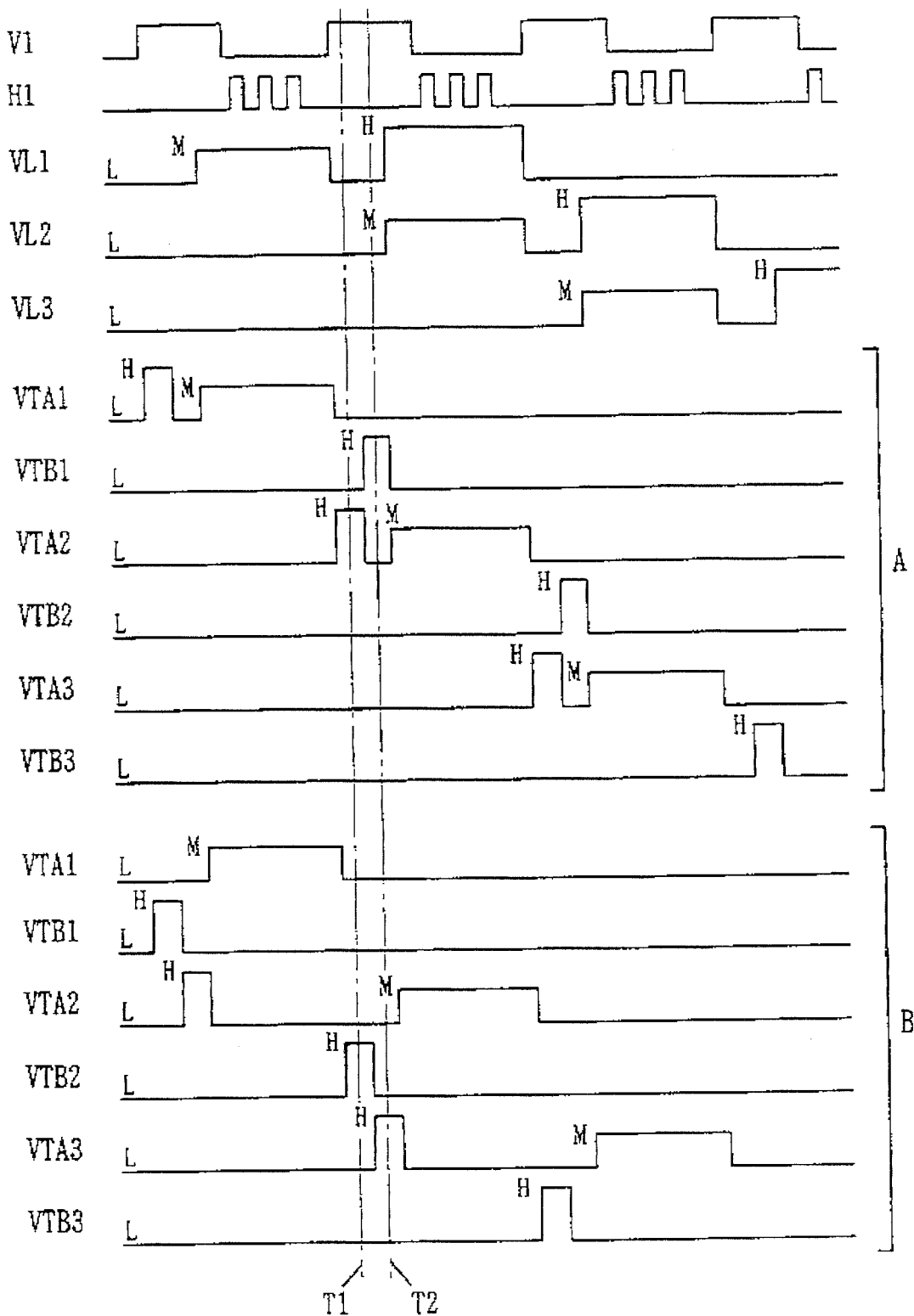
FIG. 32 is a timing chart for describing a method of driving the image sensor of FIG. 21 according to another embodiment of the present invention.
Figure 33:
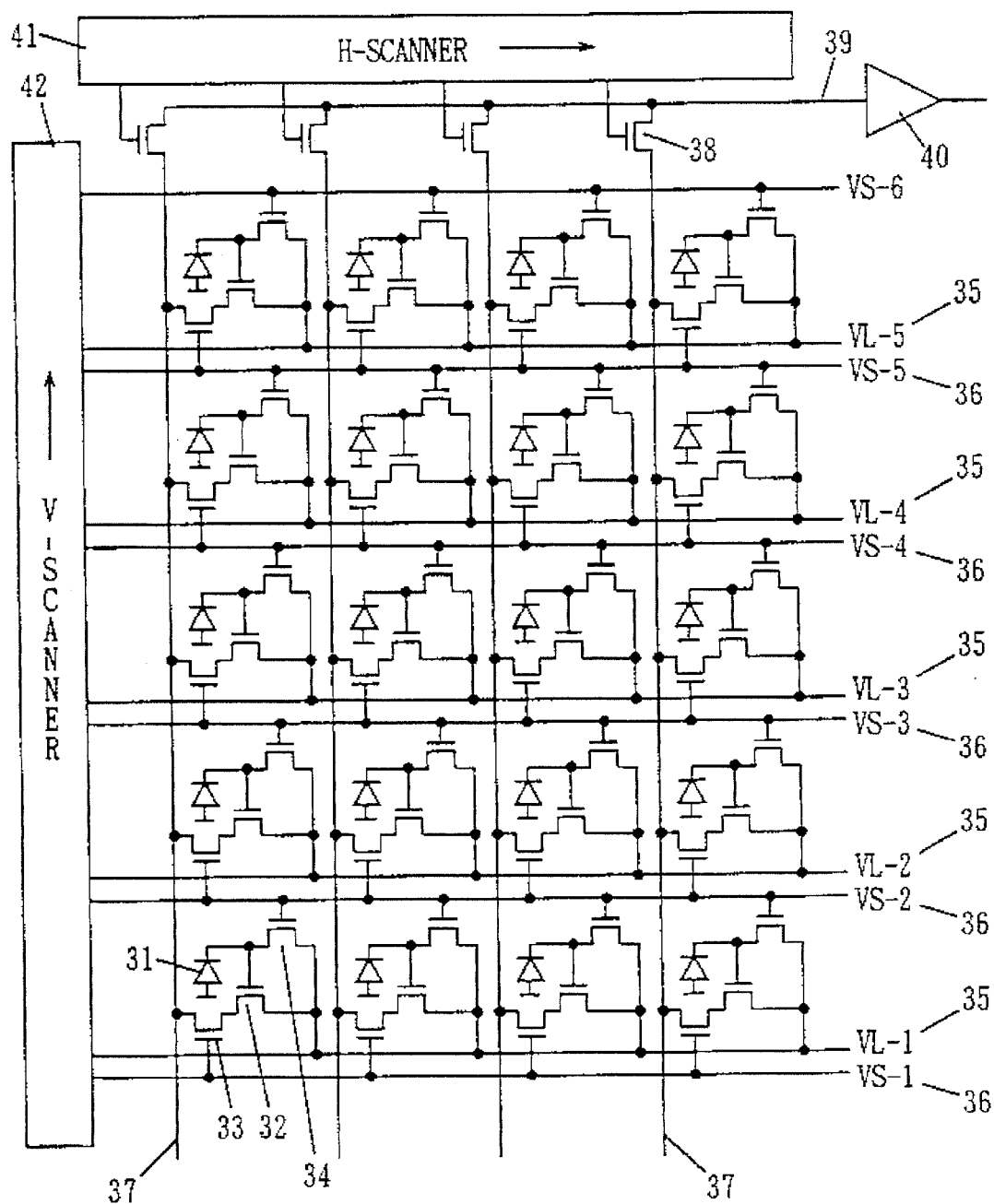
FIG. 33 is a circuit diagram schematically showing a conventional AMI type image sensor.
Figure 34:
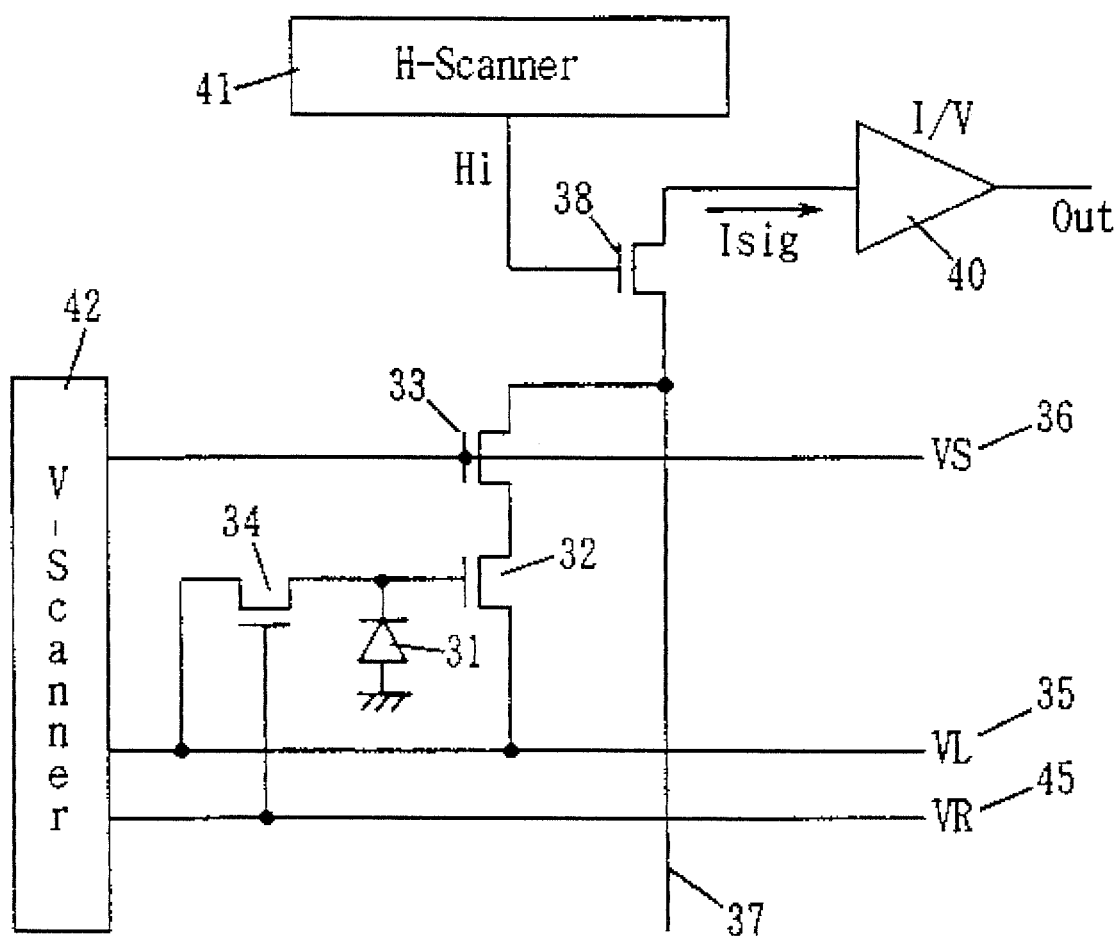
FIG. 34 is a partial circuit diagram for describing an operation of the image sensor of FIG. 33.
Figure 35:
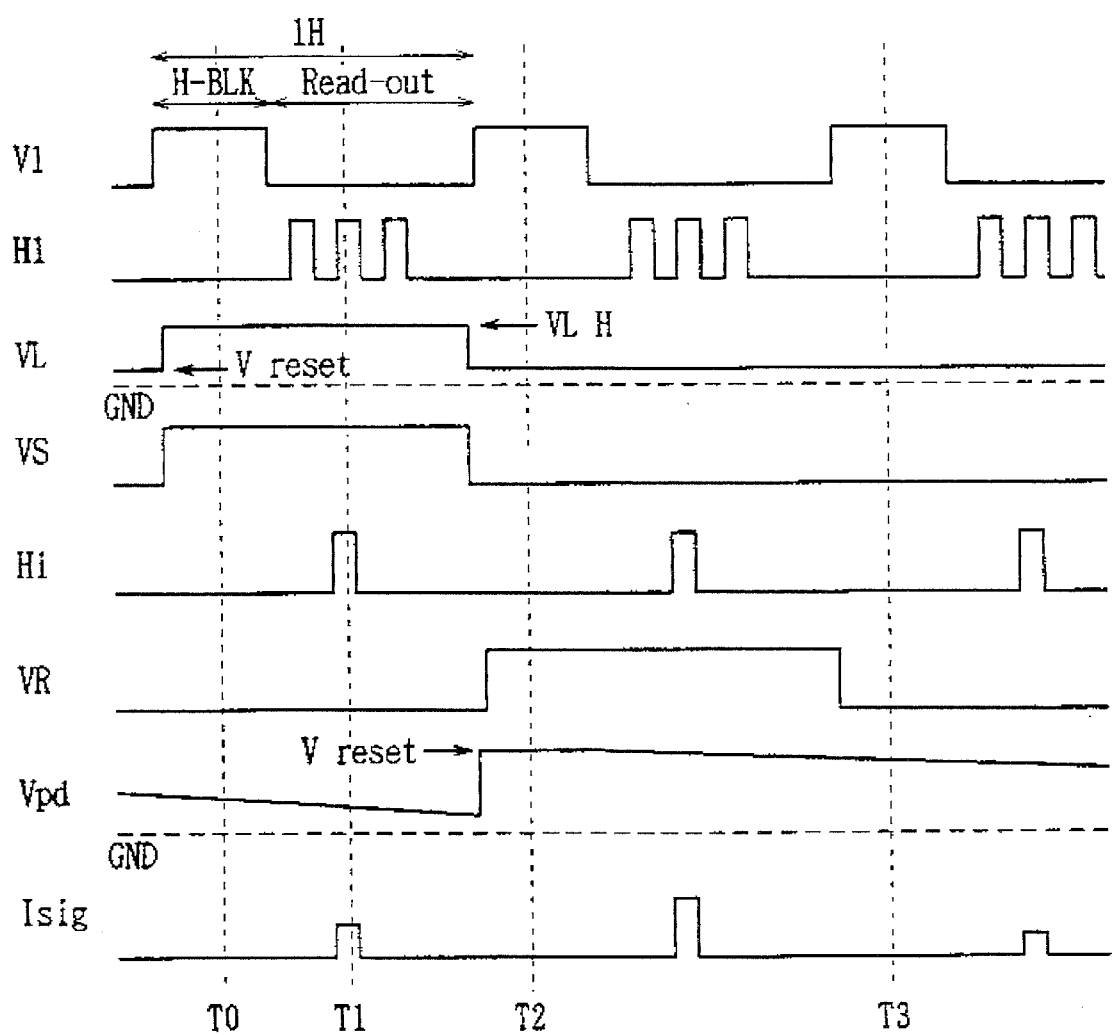
FIG. 35 is a timing chart for controlling the operation in the image sensor of FIG. 34.

FIG. 32 is a timing chart alternative of FIG. 24. The timing chart of FIG. 32 is similar to that of FIG. 24 with only the signal of power supply line VL partially modified. More specifically, when either signal line of VTA or VTB attains a H level, the plurality of power supply lines VLs near that signal line VTA or VTB attains a L level.

According to the present invention, an AMI image sensor of high integration density allowing two-line-combined readout, and a preferable driving method thereof are provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An image sensor comprising a plurality of pixels, each of said pixels including:

a photoelectric conversion element, a first MOS transistor having a gate connected to said photoelectric conversion element, a second MOS transistor connected in series with said first MOS transistor, and a third MOS transistor connected in series with said photoelectric conversion element, wherein the threshold voltage of all of said third MOS transistor is set higher than that of all of said second MOS transistor.

2. The image sensor according to claim 1, wherein said plurality of pixels are arranged in a matrix including a plurality of rows along a horizontal direction and a plurality of columns along a vertical direction, further comprising a plurality of vertical signal lines along each of said columns, and a plurality of horizontal-selection MOS transistors for selecting said vertical signal lines, wherein each said second transistor is connected to a corresponding vertical signal line.

3. The image sensor according to claim 2, further comprising a low impedance amplifier between said vertical selection line and said horizontal selection MOS transistor.

4. An image sensor comprising a plurality of pixels arranged in a matrix having a plurality of rows along a horizontal direction and a plurality of columns along a vertical direction, 1) each of the pixels included in a first group of rows of alternate rows including
      a) a photoelectric conversion element,
      b) a first MOS transistor having a gate connected to said photoelectric conversion element,
      c) a second MOS transistor connected in series with said first MOS transistor, and
      d) a third MOS transistor connected in series with said photoelectric conversion element;

2) each of the pixels included in a second group of rows of the other alternate rows including a photoelectric conversion element without said first, second and third transistors; and 3) a fourth MOS transistor for connecting a photoelectric conversion element of the second group adjacent in said column.

5. The image sensor according to claim 4, wherein the threshold voltage of said third MOS transistor is set higher than that of said second MOS transistor.

6. The image sensor according to claim 4, wherein the threshold voltage of said fourth MOS transistor is set higher than that of said second MOS transistor.

7. The image sensor according to claim 4, wherein an energy potential of a photoelectric conversion element of said first group is set deeper than that of a photoelectric conversion element of said second group.

8. The image sensor according to claim 4, further comprising a fifth MOS transistor connected in series with said third MOS transistor, wherein the gates of said third and fifth MOS transistors are connected to wirings different from each other.

9. The image sensor according to claim 4, wherein said fourth MOS transistor includes a thin film transistor.

10. The image sensor according to claim 4, wherein said fourth MOS transistor is divided into a group A connected to a photoelectric conversion element of said second group of rows in the forward direction of vertical scanning, and a group B connected to a photoelectric conversion element of said second group of rows in a direction opposite to said vertical scanning, wherein said fourth MOS transistor of said group A has a threshold voltage lower than that of said group B.

11. The image sensor according to claim 10, wherein said fourth MOS transistor of said group A has a channel length smaller than that of said group B.

12. The image sensor according to claim 10, wherein said fourth MOS transistor of said group A has a channel width larger than that of said group B.

13. A method of driving an image sensor comprising a plurality of pixels arranged in a matrix including a plurality of rows along a horizontal direction and a plurality of columns along a vertical direction, each of the pixels included in a first group of rows of alternate rows including a photoelectric conversion element, a first MOS transistor having a gate connected to said photoelectric conversion element, a second MOS transistor connected in series with said first MOS transistor, and a third MOS transistor connected in series with said photoelectric conversion element, and each of the pixels included in a second group of rows of the other alternate rows including a photoelectric conversion element, further comprising a fourth MOS transistor connecting a photoelectric conversion element of said first group to a photoelectric conversion element of said second group adjacent in said column, said method comprising the steps of:

rendering conductive a fourth MOS transistor of a selected row to combine within a photoelectric conversion element of said first group signal charge stored in photoelectric conversion elements of said first and second groups connected to said selected fourth MOS transistor, rendering conductive the other fourth MOS transistor connected to each photoelectric conversion element of said second group connected to said selected fourth MOS transistor, and reading out the charge combined in the photoelectric conversion element of said first group connected to the row of said selected fourth MOS transistor.

14. A method of driving an image sensor comprising a plurality of pixels arranged in a matrix including a plurality of rows along a horizontal direction and a plurality of columns along a vertical direction, wherein each of the pixels included in a first group of rows of alternate rows including a photoelectric conversion element, a first MOS transistor having a gate connected to said photoelectric conversion element, a second MOS transistor connected in series with said first MOS transistor, and a third MOS transistor connected in series with said photoelectric conversion element, each of the pixels included in a second group of rows of the other alternate rows including a photoelectric conversion element, and further comprising a fourth MOS transistor connecting a photoelectric conversion element of the first group and a photoelectric conversion element of the second group adjacent in said column, said method comprising the steps of:

rendering conductive a fourth MOS transistor of a selected row to combine within a photoelectric conversion element of the first group signal charge stored in photoelectric conversion elements of the first and second groups connected to said selected fourth MOS transistor, rendering conductive a fourth MOS transistor of a row subsequent to the row of said selected fourth MOS transistor in a forward direction of vertical scanning of said fourth MOS transistor to combine within a photoelectric conversion element of the first group signal charge stored in photoelectric conversion elements of the first and second groups connected to said fourth MOS transistor of a subsequent row, rendering conductive the other fourth MOS transistor connected to each photoelectric conversion element of the first group connected to said fourth MOS transistor of the selected row, and reading out charge combined in said photoelectric conversion element of the first group connected to the row of said selected fourth MOS transistor.

15. A method of driving an image sensor comprising a plurality of pixels arranged in a matrix including a plurality of rows in a horizontal direction and a plurality of columns in a vertical direction, each pixel included in a first group of rows of alternate rows including a photoelectric conversion element, a first MOS transistor having a gate connected to said photoelectric conversion element, a second MOS transistor connected in series with said first MOS transistor, and a third MOS transistor connected in series with said photoelectric conversion element, and each pixel included in a second group of rows of the other alternate rows including a photoelectric conversion element, and further comprising a fourth MOS transistor connecting a photoelectric conversion element of a first group and a photoelectric conversion element of a second group adjacent in said column, said method comprising the steps of:

rendering conductive said fourth MOS transistor of a selected i-th row to combine within a photoelectric conversion elements of a j-th row signal charge stored in a photoelectric conversion element of the first group of the j-th row and a photoelectric conversion element of a k-th row connected to a fourth MOS transistor of said i-th row, rendering conductive two of said fourth MOS transistor connected at both sides of each photoelectric conversion element of the first group of a (j−1)th row, and then, reading out charge combined in said photoelectric conversion element of the first group of said j-th row, wherein i, j and k represent a row number of said fourth MOS transistor in a forward direction of vertical scanning, a row number of a photoelectric conversion element of the first group, and a row number of a photoelectric conversion element of the second group, respectively.

16. The method of driving an image sensor according to claim 13, wherein said fourth MOS transistor is divided into a group A connected to a photoelectric conversion element of the second group of rows in a forward direction of vertical scanning, and a group B connected to a photoelectric conversion element of the second group of rows in a direction opposite to vertical scanning, wherein a fourth MOS transistor of said group A is applied with a gate voltage higher than that of said group B.

17. The method of driving an image sensor according to claim 14, wherein said fourth MOS transistor is divided into a group A connected to a photoelectric conversion element of the second group of rows in a forward direction of vertical scanning, and a group B connected to a photoelectric conversion element of the second group of rows in a direction opposite to vertical scanning, wherein a fourth MOS transistor of said group A is applied with a gate voltage higher than that of said group B.

18. The method of driving an image sensor according to claim 15, wherein said fourth MOS transistor is divided into a group A connected to a photoelectric conversion element of the second group of rows in a forward direction of vertical scanning, and a group B connected to a photoelectric conversion element of the second group of rows in a direction opposite to vertical scanning, wherein a fourth MOS transistor of said group A is applied with a gate voltage higher than that of said group B.

19. A method of driving an image sensor comprising a plurality of pixels arranged in a matrix including a plurality of rows along a horizontal direction and a plurality of columns along a vertical direction, each pixel included in a first group of rows of alternate line including a photoelectric conversion element, a first MOS transistor having a gate connected to said photoelectric conversion element, a second MOS transistor connected in series with one conductive terminal of said first MOS transistor, a power supply line connected to the other conductive terminal, and a third MOS transistor connected in series with said photoelectric conversion element, each pixel included in a second group of rows of the other alternating rows including a photoelectric conversion element, and further comprising a fourth MOS transistor connecting a photoelectric conversion element of the first group and a photoelectric conversion element of the second group adjacent in said column, said method comprising the steps of:

when a fourth MOS transistor of a selected row is rendered conductive, setting the potential of a first power supply line connected to said first MOS transistor having a gate connected to a photoelectric conversion element of said first group connected to said selected fourth MOS transistor equal to that of at least second and third power supply lines adjacent at one side and the other side of said first power supply line.

20. An image sensor comprising:

a plurality of pixels arranged in a matrix having a plurality of rows along a horizontal direction and a plurality of columns along a vertical direction, said pixels comprising a first plurality of pixels and a second plurality of pixels, (a) each of said first plurality of pixels including a photoelectric conversion element having a readout circuit therefor, (b) each of said second plurality of pixels including a photoelectric conversion element without a read circuit therefor; and means for connecting a photoelectric conversion element of the first plurality of pixels and a photoelectric conversion element of the second plurality of pixels such that said readout circuit of said first plurality of pixels is used to read out a signal generated by said photoelectric conversion element of said second plurality of pixels.

21. An image sensor comprising:

a plurality of pixels arranged in a matrix having a plurality of rows along a horizontal direction and a plurality of columns along a vertical direction, said pixels comprising a first plurality of pixels and a second plurality of pixels, each of said first plurality of pixels including
   (a) a photoelectric conversion element, and
   (b) a first MOS transistor having a gate connected to said photoelectric conversion element, and each of second plurality of pixels including a photoelectric conversion element without said first MOS transistor;

a second MOS transistor connected to in series with said first MOS transistor;

a third MOS transistor connected in series with said photoelectric conversion element;

means for connecting a photoelectric conversion element of the first plurality of pixels and a photoelectric conversion element of the second plurality of pixels.

22. An image sensor comprising:

a plurality of pixels arranged in a matrix having a plurality of rows along a horizontal direction and a plurality of columns along a vertical direction,
   (a) each of the pixels included in a first group of rows including a photoelectric conversion element having a readout circuit therefor, and
   (b) each of the pixels included in a second group of rows including a photoelectric conversion element without a readout circuit therefor; and means for connecting a photoelectric conversion element of the first group of rows and a photoelectric conversion element of the second group of rows such that said readout circuit of each of the pixels included in said first group of rows is used to read out a signal generated by said photoelectric conversion element of each of the pixels included in said second group of rows.

23. An image sensor comprising:

a plurality of pixels arranged in a matrix having a plurality of rows along a horizontal direction and a plurality of columns along a vertical direction,
   (a) each of the pixels included in a first group of rows of alternate rows including a photoelectric conversion element having a readout circuit therefor, and
   (b) each of the pixels included in a second group of rows of the other alternate rows including a photoelectric conversion element without a readout circuit therefor; and means for connecting a photoelectric conversion element of the first group and a photoelectric conversion element of the second group adjacent in said column such that said readout circuit of each of the pixels included in said first group of rows of alternate rows is used to read out a signal generated by said photoelectric conversion element of each of the pixels included in said second group of rows of the other alternate rows.

* * * * *